United States Patent
Ito et al.

(10) Patent No.: US 8,822,561 B2
(45) Date of Patent: Sep. 2, 2014

(54) CURABLE COMPOSITION AND PROCESS FOR PRODUCING CURED FILM

(71) Applicant: Asahi Glass Company, Limited, Chiyoda-ku (JP)

(72) Inventors: Masahiro Ito, Chiyoda-ku (JP); Takefumi Abe, Chiyoda-ku (JP); Kaori Tsuruoka, Chiyoda-ku (JP); Takeshi Eriguchi, Chiyoda-ku (JP)

(73) Assignee: Asahi Glass Company, Limited, Chiyoda-ku (JP)

( * ) Notice: Subject to any disclaimer, the term of this patent is extended or adjusted under 35 U.S.C. 154(b) by 0 days.

(21) Appl. No.: 13/724,571

(22) Filed: Dec. 21, 2012

(65) Prior Publication Data

US 2013/0123382 A1 May 16, 2013

Related U.S. Application Data

(63) Continuation of application No. PCT/JP2011/057699, filed on Mar. 28, 2011.

(30) Foreign Application Priority Data

Jun. 23, 2010 (JP) .................................. 2010-142828

(51) Int. Cl.
    *C08J 3/28* (2006.01)
    *C08F 2/46* (2006.01)
    *C08G 61/04* (2006.01)

(52) U.S. Cl.
    USPC .................... 522/112; 522/111; 522/1; 520/1

(58) Field of Classification Search
    USPC ................... 522/112, 111, 1; 520/1
    See application file for complete search history.

(56) References Cited

U.S. PATENT DOCUMENTS

| | | | |
|---|---|---|---|
| 7,538,177 B2 | 5/2009 | Eriguchi et al. | |
| 7,892,720 B2 | 2/2011 | Eriguchi et al. | |
| 8,168,742 B2 | 5/2012 | Yokotsuka et al. | |
| 2006/0173129 A1 | 8/2006 | Yokotsuka et al. | |
| 2008/0254388 A1* | 10/2008 | Takahashi et al. | 430/287.1 |
| 2009/0081376 A1* | 3/2009 | Ito et al. | 427/487 |
| 2010/0273967 A1 | 10/2010 | Takahashi et al. | |
| 2011/0086939 A1 | 4/2011 | Ito et al. | |
| 2011/0117496 A1 | 5/2011 | Eriguchi et al. | |
| 2012/0190809 A1* | 7/2012 | Hoshino | 526/246 |

FOREIGN PATENT DOCUMENTS

| | | |
|---|---|---|
| JP | 2005-315984 | 11/2005 |
| WO | WO 03/008483 | 1/2003 |
| WO | WO 2004/042474 | 5/2004 |
| WO | WO 2007/069703 | 6/2007 |
| WO | WO 2007/119384 | 10/2007 |
| WO | WO 2009/154254 | 12/2009 |

OTHER PUBLICATIONS

International Search Report issued Jul. 5, 2011 in PCT/JP2011/057699 filed Mar. 28, 2011.

* cited by examiner

*Primary Examiner* — Ling Choi
*Assistant Examiner* — Jessica E Whiteley
(74) *Attorney, Agent, or Firm* — Oblon, Spivak, McClelland, Maier & Neustadt, L.L.P.

(57) ABSTRACT

A curable composition that is sufficiently cured even without a heating step at high temperature and from which a low dielectric constant cured film excellent in solvent resistance is obtained. A curable composition containing a fluorinated polyarylene prepolymer (A) having a crosslinkable functional group, a compound (B) having a number average molecular weight of from 140 to 5,000, having at least two crosslinkable functional groups and having no fluorine atoms, a copolymer (C) having the following units (c1) and (c2) and a radical polymerization initiator (D): unit (c1): a unit having a fluoroalkyl group having at most 20 carbon atoms, which may have an etheric oxygen atom between carbon atoms, and having no crosslinkable functional group; unit (c2): a unit having a crosslinkable functional group.

12 Claims, 4 Drawing Sheets

CURABLE COMPOSITION AND PROCESS FOR PRODUCING CURED FILM

TECHNICAL FIELD

The present invention relates to a curable composition and a process for producing a cured film by using the curable composition.

BACKGROUND ART

In the electronics filed, development of insulating materials having low dielectric constants is advancing. For example, a polyarylene resin has been proposed as an insulating material suitable for an interlayer insulating film for semiconductor devices, a gate insulating film for thin-film transistors (TFT), a stress relaxation layer for a redistribution layer, etc. (Patent Document 1).

Further, a negative photosensitive resin composition has been proposed wherein a polyarylene resin has been provided with photosensitivity (Patent Document 2). With such photosensitivity, microfabrication by photolithography becomes possible in the same manner as e.g. a photoresist. For example, when an interlayer insulating film is formed by using a polyarylene resin having photosensitivity, there is such a merit that a contact hole can easily be formed in the interlayer insulating film by photolithography without using a photoresist.

In recent years, various flexible devices attract attention. For example, for a TFT for a flexible display, an inexpensive resin substrate such as polyethylene terephthalate (PET) or polyethylene naphthalate (PEN) is preferably used. However, as such a resin substrate has a heat resistant temperature of so low as from 150 to 200° C., it is necessary to produce the TFT at low temperature so that the substrate is maintained to the heat resistant temperature or below in the entire process.

Further, depending on the application, the surface of a cured film with a low dielectric constant is required to have liquid repellency in some cases. For example, in a case where a gate insulating film is formed by a low dielectric constant material and an organic semiconductor layer is provided thereon, in order to increase the degree of orientation of molecules of the organic semiconductor to improve the electron mobility, the surface of the gate insulating film preferably has liquid repellency.

The following Patent Document 3 discloses to add, as an ink repellent, a copolymer having units having a fluorine-substituted alkyl group and units having an ethylenic double bond to a negative photosensitive composition containing a (meth)acrylic resin as the main component.

Further, the following Patent Document 4 discloses that in a method of forming a low dielectric constant insulating film or the like by using a curable composition containing a fluorinated polyarylene prepolymer by means of a heating step at 300° C. or above, by incorporating a compound having a molecular weight of from 140 to 5,000, having a crosslinkable functional group and having no fluorine atoms in the curable composition, the flatness of the film surface is improved.

PRIOR ART DOCUMENTS

Patent Documents

Patent Document 1: WO2003/008483
Patent Document 2: WO2007/119384
Patent Document 3: WO2004/042474
Patent Document 4: WO2009/154254

DISCLOSURE OF INVENTION

Technical Problem

With a conventional curable composition comprising a fluorinated polyarylene resin, a step of imparting an external energy such as heat or light to a fluorinated prepolymer having a crosslinkable functional group for crosslinking is necessary, and for sufficient curing, a curing step at high temperature of at least 300° C. is necessary. If curing is insufficient, for example, the solvent resistance of the obtainable cured film is insufficient, and when the cured film is brought into contact with a solvent in a device production process, swelling or reduction in thickness of the cured film may occur. Accordingly, it has been considered that a fluorinated polyarylene resin cannot be used for a low temperature process using a substrate having a low heat resistant temperature.

Further, even if the heat resistant temperature of the substrate such as a silicon substrate is not low, in a case of forming a cured film on a substrate having a large area, the substrate is likely to be warped when cured at high temperature.

Accordingly, a curable composition which is sufficiently cured even without a heating step at high temperature, and which is capable of forming a cured film having a favorable solvent resistance, a low dielectric constant and a favorable liquid repellency on the surface is desired.

The present invention has been made under these circumstances, and its object is to provide a curable composition which is sufficiently cured even without a heating step at high temperature, and which is capable of forming a cured film having an excellent solvent resistance, a low dielectric constant and a favorable liquid repellency on the surface, a process for producing a cured film by using the curable composition, and an organic thin-film transistor using a cured film obtainable by curing the curable composition.

Solution to Problem

The present invention provides the following [1] to [15].
[1] A curable composition comprising a fluorinated polyarylene prepolymer (A) having a crosslinkable functional group, a compound (B) having a number average molecular weight of from 140 to 5,000, having at least two crosslinkable functional groups and having no fluorine atoms, a copolymer (C) having the following units (c1) and (c2) and a radical polymerization initiator (D):
  unit (c1): a unit having a fluoroalkyl group having at most 20 carbon atoms, which may have an etheric oxygen atom between carbon atoms, and having no crosslinkable functional group;
  unit (c2): a unit having a crosslinkable functional group.
[2] The curable composition according to [1], wherein each of the crosslinkable functional groups in the prepolymer (A), the compound (B) and the compound (C) which are independent of one another, is a crosslinkable functional group selected from the group consisting of a vinyl group, an allyl group, an ethynyl group, a vinyloxy group, an allyloxy group, an acryloyl group, an acryloyloxy group, a methacryloyl group and a methacryloyloxy group.
[3] The curable composition according to [1] or [2], which contains from 10 to 80 parts by mass of the compound (B) based on the total amount (100 parts by mass) of the prepolymer (A) and the compound (B).
[4] The curable composition according to any one of [1] to [3], wherein the radical polymerization initiator (D) is a thermal initiator or a photoinitiator.

[5] The curable composition according to any one of [1] to [4], which contains from 0.1 to 20 parts by mass of the copolymer (C) based on the total amount (100 parts by mass) of the prepolymer (A) and the compound (B).

[6] The curable composition according to any one of [1] to [5], wherein the unit (c1) is a unit formed by polymerization of a monomer represented by the following formula (4):

V-Q-R—Cf          (4)

wherein V: a polymerizable group,
Q: a single bond or a bivalent organic group,
Cf: a fluoroalkyl group having at most 20 carbon atoms, which may have an etheric oxygen atom between carbon atoms, and
R: a single bond or a bivalent organic group.

[7] The curable composition according to [6], wherein the unit (c1) is a unit formed by polymerization of a monomer represented by the following formula (5):

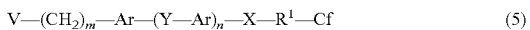

V—(CH$_2$)$_m$—Ar—(Y—Ar)$_n$—X—R$^1$—Cf          (5)

wherein V: a polymerizable group,
Ar: an aromatic ring which may have a C$_{1-15}$ alkyl group or a halogen atom,
R$^1$: a single bond or a C$_{1-15}$ alkylene group,
Cf: a fluoroalkyl group having at most 20 carbon atoms, which may have an etheric oxygen atom between carbon atoms,
X: —CH$_2$O— or —COO—
Y: a single bond, —OCH$_2$—, —CH$_2$O—, a C$_{1-4}$ alkylene group, —O—, —OCH$_2$—, —CO—, —SO$_2$— or —S—,
m: an integer of from 0 to 4, and
n: 0 or 1.

[8] A coating composition comprising the curable composition as defined in any one of [1] to [7] and a solvent.

[9] A process for producing a curable composition, which comprises
reacting a fluorinated aromatic compound, a phenol compound and a crosslinkable functional group-containing organic compound in the presence of a dehydrohalogenating agent to produce a fluorinated polyarylene prepolymer (A) having a crosslinkable functional group, and
mixing the above prepolymer (A), a compound (B) having a number average molecular weight of from 140 to 5,000, having at least two crosslinkable functional groups and having no fluorine atoms, a copolymer (C) having the following units (c1) and units (c2) and a radical polymerization initiator (D):
unit (c1): a unit having an alkyl group having at most 20 carbon atoms (which may contain an etheric oxygen atom), having at least one of hydrogen atoms being substituted by a fluorine atom, and having no crosslinkable functional group;
unit (c2): a unit having a crosslinkable functional group.

[10] A process for producing a cured film, which comprises forming a film of the coating composition as defined in [8] on a substrate, and thermally curing or photo-curing the curable composition by a step including one or more heating steps to produce a cured film, wherein the heating temperature in all the heating steps is at most 250° C.

[11] A substrate having a cured film of the curable composition as defined in any one of [1] to [7].

[12] A method for treating a cured film, which comprises irradiating a cured film of the curable composition as defined in [7] with light to lower the liquid repellency at a light-irradiated portion.

[13] An organic thin-film transistor having a cured film obtained by curing a film of the curable composition as defined in any one of [1] to [7] as a functional film.

[14] The organic thin-film transistor according to [13], wherein the functional film is a gate insulating film.

[15] A non-adhesion imparting agent comprising a copolymer having units formed by polymerization of a monomer represented by the following formula (5) and units having a crosslinkable functional group:

V—(CH$_2$)$_m$—Ar—(Y—Ar)$_n$—X—R$^1$—Cf          (5)

wherein V: a polymerizable group,
Ar: an aromatic ring which may have a C$_{1-15}$ alkyl group or a halogen atom,
R$^1$: a single bond or a C$_{1-15}$ alkylene group,
Cf: a fluoroalkyl group having at most 20 carbon atoms, which may have an etheric oxygen atom between carbon atoms,
X: —CH$_2$O— or —COO—
Y: a single bond, —OCH$_2$—, —CH$_2$O—, a C$_{1-4}$ alkylene group, —O—, —OCH$_2$—, —CO—, —SO$_2$— or —S—,
m: an integer of from 0 to 4, and
n: 0 or 1.

Advantageous Effects of Invention

As the curable composition of the present invention is sufficiently cured even without a heating step at high temperature, it can be used in a step (low temperature process) wherein the maximum heating temperature is at most 250° C., and a cured film having an excellent solvent resistance, a low dielectric constant and a favorable liquid repellency on the surface can be obtained. In the present invention, "a favorable liquid repellency" means both favorable water repellency and favorable oil repellency.

According to the process for producing a cured film of the present invention, a cured film having an excellent solvent resistance, a low dielectric constant and a favorable liquid repellency on the surface can be formed without a heating step at high temperature. Accordingly, it is applicable to a low temperature process using a substrate having a low heat resistance. Further, in a case where the substrate has a large area, warpage of the substrate can be prevented.

The cured film obtainable by curing the curable composition of the present invention is useful as a gate insulating film for an organic thin-film transistor.

DESCRIPTION OF EMBODIMENTS

Figure 1:
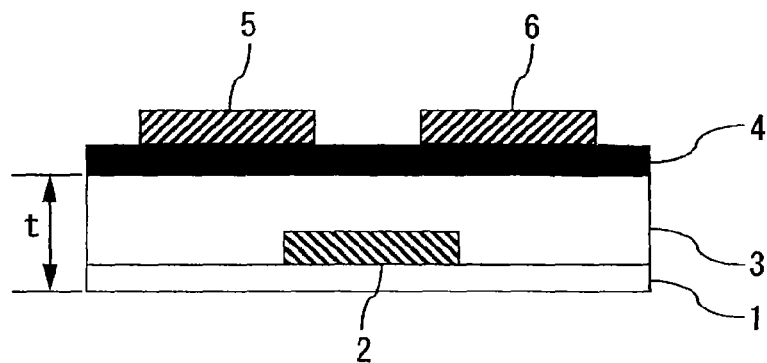
FIG. 1 is a cross-sectional view schematically illustrating one embodiment of an organic thin-film transistor using the cured film of the present invention.

In the present invention, a crosslinkable functional group is a functional group capable of being polymerized by a radical. In the present invention, a radical is generated from a radical polymerization initiator (D) by an action of an external energy, this radical brings about a polymerization reaction of the crosslinkable functional group, and this polymerization reaction brings about reactions such as polymerization, crosslinking and chain elongation of a compound having the crosslinkable functional group. The compound having a crosslinkable functional group in the present invention is the after-mentioned prepolymer (A), compound (B), copolymer (C) and the like.

In the present invention, as the external energy, heat or light is employed. They may be used in combination.

In a case where heat is employed as the external energy, a thermal initiator (D1) may be used in combination. The reaction temperature of the crosslinkable functional group is preferably at least 40° C., more preferably at least 60° C., particularly preferably at least 70° C., since if it is too low, stability of the compound having the crosslinkable functional group or a composition containing it during storage cannot be secured. The upper limit of the reaction temperature is at most the upper limit of the heating temperature acceptable in the step for producing the cured film, and for example, at most the heat resistant temperature of a substrate. When the crosslinkable functional group is reactive at a lower temperature, such a compound is applicable to a lower temperature process. For example, the reaction temperature of the crosslinkable functional group is preferably at most 250° C., particularly preferably at most 200° C.

In a case where light (actinic rays) is employed as the external energy, the compound having the crosslinkable functional group and a photoinitiator (D2) are used in combination. In such a case, the curable composition at the exposed portion is cured by irradiation with actinic rays in an exposure step. As the case requires, heating may be conducted after the exposure and/or development step.

The crosslinkable functional group in the present invention may, for example, be a carbon-carbon unsaturated double bond which may undergo polymerization by a radical, a carbon-carbon unsaturated triple bond which may undergo polymerization by a radical, a ring which will be opened by a radical, a group containing them.

The above unsaturated double bond and unsaturated triple bond may be present in the interior of the molecular chain (hereinafter sometimes referred to as internal olefin type) or may be present at the terminal (hereinafter sometimes referred to as terminal olefin type), but is preferably present at the terminal in view of a high reactivity. In the case of the unsaturated double bond, it may be the internal olefin type or the terminal olefin type, but is preferably the terminal olefin type. Being present in the interior of the molecular chain includes being present in a part of an aliphatic ring such as a cycloolefin. The terminal olefin type crosslinkable functional group is preferably an alkenyl group having at most 4 carbon atoms or an alkynyl group having at most 4 carbon atoms.

Specifically, it may, for example, be a vinyl group, an allyl group, an isopropenyl group, a 3-butenyl group, a methacryloyl group, a methacryloyloxy group, an acryloyl group, an acryloyloxy group, a vinyloxy group, an allyloxy group, a trifluorovinyl group, a trifluorovinyloxy group, an ethynyl group, a 1-oxocyclopenta-2,5-dien-3-yl group, a cyano group, an alkoxysilyl group, a diarylhydroxymethyl group, a hydroxyfluolenyl group, a cyclobutarene ring or an oxirane ring.

The crosslinkable functional group in the present invention is preferably a crosslinkable functional group selected from the group consisting of a vinyl group, an allyl group, an ethynyl group, a vinyloxy group, an allyloxy group, an acryloyl group, an acryloyloxy group, a methacryloyl group and a methacryloyloxy group, in view of a high reactivity thereby to obtain a cured film having a high crosslink density.

The crosslinkable functional group in the after-mentioned prepolymer (A) is particularly preferably a vinyl group or an ethynyl group, in view of a low reactivity at the time of producing the prepolymer (A) and a favorable reactivity in the presence of a radical polymerization initiator (D).

The crosslinkable functional group in the after-mentioned compound (B) is more preferably a crosslinkable functional group selected from the group consisting of an acryloyl group, an acryloyloxy group, a methacryloyl group and a methacryloyloxy group in view of a high reactivity and availability, and is particularly preferably an acryloyl group or an acryloyloxy group in view of a higher reactivity.

The crosslinkable functional group in the after-mentioned copolymer (C) is particularly preferably an acryloyl group, an acryloyloxy group, a methacryloyl group and a methacryloyloxy group in view of a high reactivity with the crosslinkable functional group of another compound.

Each of the after-mentioned prepolymer (A), compound (B) and copolymer (C) may have two or more types of crosslinkable functional groups in one molecule. Further, the crosslinkable functional groups in the prepolymer (A), the compound (B) and the copolymer (C) which coexist in the curable composition may be the same or different.

In this specification, a methacryloyl group and a methacryloyloxy group will generically be referred to as a methacryloyl(oxy) group. The same applies to an acryloyl(oxy) group. Further, an acryloyl group and a methacryloyl group will generically be referred to as a (meth)acryloyl group. The same applies to a (meth)acryloyloxy group. Further, all of them may sometimes be generically referred to as a (meth)acryloyol(oxy) group.

<Fluorinated Polyarylene Prepolymer (A)>

The fluorinated polyarylene prepolymer (A) (hereinafter sometimes referred to simply as a prepolymer (A)) has a polyarylene structure wherein a plurality of aromatic rings are bonded via a single bond or a linking group, and at the same time it has fluorine atoms and a crosslinkable functional group. By the curable composition containing the prepolymer (A), the obtainable cured film can have a low dielectric constant.

The crosslinkable functional group of the prepolymer (A) does not substantially undergo a reaction at the time of producing the prepolymer (A), and by applying an external energy in the presence of the radical polymerization initiator (D), it undergoes a radical polymerization reaction to cause crosslinking between molecules of the prepolymer (A) or chain elongation. Further, it is considered to react with the crosslinkable functional groups of the compound (B) and the copolymer (C) to form a cured film together with them. As mentioned above, the crosslinkable functional group in the prepolymer (A) is particularly preferably a vinyl group or an ethynyl group.

The linking group in the polyarylene structure may, for example, be an ether bond (—O—), a sulfide bond (—S—), a carbonyl group (—CO—) or a sulfonyl group (—SO$_2$—). Among prepolymers (A), one having a structure wherein aromatic rings are bonded to one another by a linking group including an ether bond (—O—) is referred to as a fluorinated polyarylene ether prepolymer. The prepolymer (A) in the present invention preferably contains such a fluorinated polyarylene ether prepolymer, and it is particularly preferred that the prepolymer (A) consists solely of the fluorinated polyarylene ether prepolymer.

As a specific example of such a linking group containing an ether bond, an ether bond (—O—) composed solely of an etheric oxygen atom or an alkylene group containing an etheric oxygen atom in its carbon chain may, for example, be exemplified.

Among prepolymers (A), a fluorinated polyarylene ether prepolymer is particularly preferred in that it has an etheric oxygen atom, whereby the molecular structure has flexibility, and the flexibility of the cured film is good.

The prepolymer (A) has fluorine atoms. As it has fluorine atoms, the dielectric constant and the dielectric loss of a cured film tend to be low, such being desirable as a material to form an insulating film. When the dielectric constant and dielectric loss of an insulating film are low, it is possible to prevent delay of a signal propagation velocity and to obtain a device excellent in electrical properties.

Further, as it has fluorine atoms, the water absorption of the cured film becomes low, whereby it is possible to prevent a change in the bonded state at the bonded electrodes and wiring portions therearound, or it is possible to prevent modification (such as rusting) of metals. It presents a substantial effect to improve the reliability of a device.

A preferred example of such a prepolymer (A) may be a prepolymer obtainable by reacting, in the presence of a dehydrohalogenating agent such as potassium carbonate, a fluorinated aromatic compound such as perfluoro(1,3,5-triphenylbenzene) or perfluorobiphenyl; a phenolic compound such as 1,3,5-trihydroxybenzene or 1,1,1-tris(4-hydroxyphenyl)ethane; and a crosslinkable functional group-containing aromatic compound such as pentafluorostyrene, acetoxystyrene, chloromethylstyrene or pentafluorophenylacetylene. The reaction may be carried out by a known method.

The reaction is carried out preferably in a solvent. The solvent may, for example, be preferably a solvent containing an aprotic polar solvent such as N,N-dimethylacetamide, N,N-dimethylformamide, N-methylpyrrolidone, dimethylsulfoxide or sulfolane. The polar solvent may contain toluene, xylene, benzene, tetrahydrofuran, benzotrifluoride, xylenehexafluoride or the like within a range where the solubility of the prepolymer to be formed will not be lowered, and the condensation reaction will not adversely be affected. When such a component is contained, the polarity (dielectric constant) of the solvent is changed, and it is possible to control the reaction rate.

The number average molecular weight (Mn) of the prepolymer (A) is preferably from 1,000 to 100,000, particularly preferably from 5,000 to 50,000. When the number average molecular weight (Mn) is at least the lower limit of the above range, the flexibility of the obtainable cured film will not be lowered, and when it is at most the upper limit of the above range, purification of the curable composition will be easy.

The number average molecular weight (Mn) in this specification is a molecular weight calculated as polystyrene obtained by measurement by means of gel permeation chromatography using an analytical curve prepared by using a standard polystyrene sample having a known molecular weight.

<Compound (B)>

The compound (B) is a compound having a number average molecular weight (Mn) of from 140 to 5,000, having at least two crosslinkable functional groups and having no fluorine atoms. By incorporating the compound (B) in the curable composition, a cured film having a higher hardness will be produced.

The number average molecular weight (Mn) of the compound (B) is preferably from 200 to 3,000, particularly preferably from 250 to 2,500. When it is at least the lower limit of the above range, evaporation by heating is less likely to occur. When it is at most the upper limit of the above range, the viscosity of the compound (B) can be controlled to be low, and a uniform curable composition can easily be obtainable when it is mixed with the prepolymer (A).

As the compound (B) has at least two crosslinkable functional groups, it can crosslink molecules. The compound (B) preferably has from 2 to 20, particularly preferably from 2 to 8 crosslinkable functional groups.

The crosslinkable functional groups of the compound (B) contain no fluorine atoms and are preferably groups which react in the same step as the step in which the crosslinkable functional group of the prepolymer (A) undergoes a radical polymerization reaction.

The crosslinkable functional groups of the compound (B) at least undergo a reaction with the compound (B) to cause crosslinking or chain elongation. It is considered that they react with the crosslinkable functional groups of the prepolymer (A) and the copolymer (C) to form a cured film together with them. The crosslinkable functional groups of the compound (B) are preferably (meth)acryloyl(oxy) groups, more preferably (meth)acryloyloxy groups, particularly preferably acryloyl groups or acryloyloxy groups.

Specific examples of the compound (B) may, for example, be dipentaerythritol triacrylate triundecylate, dipentaerythritol pentaacrylate monoundecylate, ethoxylated isocyanuric acid triacrylate, ∈-caprolactone-modified tris-(2-acryloxyethyl)isocyanurate, 9,9-bis[4-(2-acryloyloxyethoxy)phenyl]fluorene, polyethylene glycol diacrylate, polyethylene glycol dimethacrylate, polypropylene glycol diacrylate, polypropylene glycol dimethacrylate, ethoxylated bisphenol A diacrylate, ethoxylated bisphenol A dimethacrylate, propoxylated bisphenol A diacrylate, propoxylated bisphenol A dimethacrylate, 1,10-decanediol diacrylate, 1,6-hexanediol diacrylate, 1,6-hexanediol dimethacrylate, 1,4-butanediol dimethacrylate, 1,3-butanediol dimethacrylate, hydroxypivalic acid neopentyl glycol diacrylate, 1,9-nonanediol diacrylate, 1,9-nonanediol dimethacrylate, neopentyl glycol diacrylate, neopentyl glycol dimethacrylate, pentaerythritol triacrylate, trimethylolpropane triacrylate, ethoxylated trimethylolpropane triacrylate, propoxylated trimethylolpropane triacrylate, triallyl cyanurate, triallyl isocyanurate, trimethallyl isocyanurate, 1,4-butanediol divinyl ether, 1,9-nonanediol divinyl ether, cyclohexane dimethanol divinyl ether, triethylene glycol divinyl ether, trimethylolpropane trivinyl ether, pentaerythritol tetravinyl ether, 2-(2-vinyloxyethoxy)ethyl acrylate, 2-(2-vinyloxyethoxy)ethyl methacrylate, trimethylolpropane diallyl ether, pentaerythritol triallyl ether, dipentaerythritol hexaacrylate, pentaerythritol tetraacrylate, an ethoxylated pentaerythritol tetraacrylate represented by the following formula (1), a propoxylated pentaerythritol tetraacrylate represented by the following formula (2), ditrimethylolpropane tetraacrylate, tricyclodecane dimethanol diacrylate, tricyclodecane dimethanol methacrylate, and a compound represented by the following formula (3).

Further, polyester acrylates (a compound obtained by modifying both terminals of a condensate of a dihydric alcohol and a dibasic acid with acrylic acid: tradename Aronix (M-6100, M-6200, M-6250 or M-6500), manufactured by TOAGOSEI CO., LTD.; and a compound obtained by modifying terminal hydroxy groups of a condensate of a polyhydric alcohol and a polybasic acid, with acrylic acid: tradename Aronix (M-7100, M-7300K, M-8030, M-8060, M-8100, M-8530, M-8560 or M-9050) manufactured by TOAGOSEI CO., LTD.) may also be used. These products are available from commercial products.

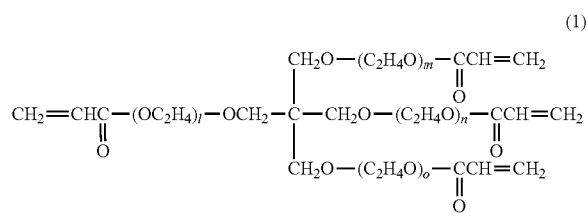

(1)

(In the formula, l+m+n+o is from 4 to 35.)

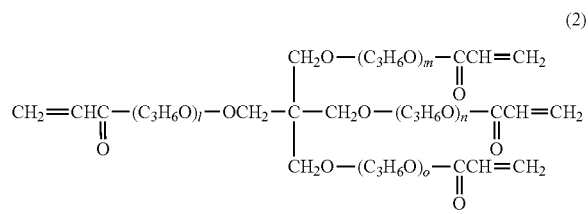

(2)

(In the formula, l+m+n+o is about 4.)

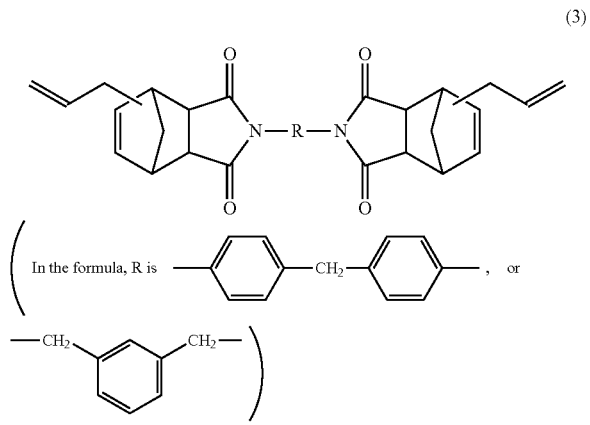

(3)

Particularly preferred as the compound (B) to be used in the present invention is, in view of the availability and the reactivity, ethoxylated isocyanuric acid triacrylate, 1,10-decanediol diacrylate, 1,9-nonanediol diacrylate, 1,9-nonanediol dimethacrylate, trimethylolpropane triacrylate, dipentaerythritol hexaacrylate, pentaerythritol tetraacrylate, ditrimethylolpropane tetraacrylate or tricyclodecane dimethanol diacrylate.

The content of the compound (B) contained in the curable composition is preferably from 10 to 80 parts by mass, more preferably from 15 to 70 parts by mass, particularly preferably from 20 to 60 parts by mass based on the total amount (100 parts by mass) of the prepolymer (A) and the compound (B). When the proportion of the compound (B) is at least the lower limit of the above range, a sufficient effect of improving the curing property when cured at low temperature will be obtained, and the solvent resistance of the obtainable cured film will sufficiently be improved. Further, when the content of the compound (B) is at most the upper limit of the above range, the dielectric constant of the cured film will sufficiently be low.

<Copolymer (C)>

The curable composition of the present invention contains a copolymer (C). When it contains the copolymer (C), the liquid repellency on the surface of the cured film will be improved.

The copolymer (C) is a polymer having units (c1) having a fluoroalkyl group (hereinafter sometimes referred to as a Cf group) having at most 20 carbon atoms which may have an etheric oxygen atom between carbon atoms, and units (c2) having a crosslinkable functional group. The unit (c1) has no crosslinkable functional group.

The crosslinkable functional groups of the copolymer (C) are considered to react with the crosslinkable functional groups of the prepolymer (A) and the compound (B) to form a cured film together with them. As described above, the crosslinkable functional groups of the copolymer (C) are particularly preferably (meth)acryloyl groups or (meth)acryloyloxy groups in view of high reactivity with the crosslinkable functional groups of other compounds.

The Cf group in the unit (c1) may be linear or branched. The Cf group may have an etheric oxygen atom between carbon atoms. Further, the number of carbon atoms in the Cf group is at most 20. The number of carbon atoms in the Cf group includes all the carbon atoms to which fluorine atoms or trifluoromethyl groups are bonded, and is defined so that the total number of carbon atoms becomes smallest.

The Cf group is preferably such that the number of fluorine atoms based on the total number of fluorine atoms and hydrogen atoms is at least 80%, particularly preferably 100%.

The fluoroalkyl group may, for example, be specifically $CF_3$, $CF_2CF_3$, $CF(CF_3)_2$, $CH(CF_3)_2$, $CF_2CHF_2$, $(CF_2)_2CF_3$, $(CF_2)_3CF_3$, $(CF_2)_4CF_3$, $(CF_2)_5CF_3$, $(CF_2)_6CF_3$, $(CF_2)_7CF_3$, $(CF_2)_8CF_3$, $(CF_2)_9CF_3$, $(CF_2)_{11}CF_3$ or $(CF_2)_{15}CF_3$.

Further, the fluoroalkyl group having an etheric oxygen atom may, for example, be specifically $CF(CF_3)O(CF_2)_5CF_3$, $CF_2O(CF_2CF_2O)_pCF_3$ (p is an integer of from 1 to 8), $CF(CF_3)O(CF_2CF(CF_3)O)_qC_6F_{13}$ (q is an integer of from 1 to 4) or $CF(CF_3)O(CF_2CF(CF_3)O)_rC_3F_7$ (r is an integer of from 1 to 5).

The Cf group is preferably a perfluoroalkyl group, whereby the liquid repellency of the surface of the obtainable cured film will be more favorable. Further, the number of carbon atoms in the Cf group is preferably from 2 to 20, more preferably from 2 to 15, particularly preferably from 4 to 8, whereby not only excellent liquid repellency will be obtained but also the compatibility of the after-mentioned monomer having the Cf group with another monomer to be copolymerized will be favorable.

The units (c1) having a Cf group in the copolymer (C) are preferably formed by polymerizing a monomer having a Cf group. Otherwise, the units (c1) having a Cf group may be obtained by various modification methods of reacting a compound having a Cf group with a polymer having a reactive moiety.

The units (c1) in the copolymer (C) are preferably units formed by polymerization of a monomer, and in such a case, a polymerizable group (a group of the same type as the crosslinkable functional group) of the monomer is lost by polymerization, and accordingly the unit (c1) has no crosslinkable functional group.

Now, a monomer (c1 m) to give units (c1) having a Cf group will be described below.

The monomer (c1m) is preferably a derivative (a derivative having a polymerizable group) of e.g. a monool having a Cf group, a monoepoxide having a Cf group, a monocarboxylic acid having a Cf group or a monosulfonic acid having a Cf group, particularly preferably a derivative of a monool having a Cf group.

The monool having a Cf group is preferably a monool represented by HO—R—Cf. R is a single bond or a bivalent organic group and is preferably an alkylene group. However, the bivalent organic group is not limited to an alkylene group and may be —$R^{11}$—$NR^{21}$—CO— or —$R^{11}$—$NR^{21}$—$SO_2$—. $R^{11}$ is an alkylene group, and $R^{21}$ is a hydrogen atom or an alkyl group. Further, in the case of a monool having a hydroxy group directly bonded to a carbon atom of a fluoroalkyl group (for example, HO—CH(CF$_3$)$_2$), R may be a single bond.

In a case where R is an alkylene group, its number of carbon atoms is preferably from 1 to 10, more preferably from 2 to 6, particularly preferably from 2 to 4. The number of carbon atoms in $R^{11}$ is also preferably the same, and $R^{21}$ is preferably a hydrogen atom or an alkyl group having at most 4 carbon atoms.

In a case where R is a $C_{1-10}$ alkylene group, it may, for example, be specifically —CH$_2$—, —CH$_2$CH$_2$—, —CH(CH$_3$)—, —CH$_2$CH$_2$CH$_2$—, —C(CH$_3$)$_2$—, —CH(CH$_2$CH$_3$)—, —CH$_2$CH$_2$CH$_2$CH$_2$—, —CH(CH$_2$CH$_2$CH$_3$)—, —CH$_2$(CH$_2$)$_3$CH$_2$— or —CH(CH$_2$CH(CH$_3$)$_2$)—. $R^1$ is preferably a linear alkylene group, particularly preferably —CH$_2$—, —CH$_2$CH$_2$—, —CH$_2$CH$_2$CH$_2$— or —CH$_2$CH$_2$CH$_2$CH$_2$—.

The polymerizable group is preferably a vinyl group, an allyl group, a (meth)acryloyl group, a (meth)acryloyloxy group, a vinyloxy group or an allyloxy group, particularly preferably a vinyl group or a (meth)acryloyloxy group.

The monomer (dm) is particularly preferably a compound having a residue of the monool having a Cf group and the above polymerizable group. Such a monomer may be a compound represented by the following formula (4) (hereinafter referred to as monomer (4)):

V-Q-R—Cf           (4)

wherein V: a polymerizable group,

Q: a single bond or a bivalent organic group,

Cf: a fluoroalkyl group which may have an etheric oxygen atom between carbon atoms, and R: a single bond or a bivalent organic group.

In the above monomer (4), R is the residue of the above monool, and is preferably a single bond or an alkylene group as mentioned above. A preferred alkylene group is the same as above.

In the above monomer (4), the polymerizable group represented by V is preferably a vinyl group, an allyl group, a (meth)acryloyl group, a (meth)acryloyloxy group, a vinyloxy group or an allyloxy group, particularly preferably a vinyl group or a (meth)acryloyloxy group.

In the above monomer (4), Q may be a single bond. In such a case, V is a polymerizable group having an oxygen atom at the terminal of the connecting bond, and the oxygen atom is an oxygen atom in an ether bond, an oxygen atom at the alcohol residue side of an ester bond, or the like. Such an oxygen atom is an oxygen atom derived from the monool having a Cf group. In a case where Q is a single bond, V is particularly preferably a (meth)acryloyloxy group.

In the above monomer (4), Q may also be a bivalent organic group. In such a case, Q is a bivalent organic group having an oxygen atom at the terminal of the bond on the R side. The oxygen atom is an oxygen atom of an ether bond, an oxygen atom on the alcohol residue side of an ester bond, or the like. This oxygen atom is an oxygen atom derived from the monool having a Cf group. In a case where Q is a bivalent organic group, its number of carbon atoms is preferably at most 25, and is preferably at most 12 when it has one aromatic ring as described hereinafter, at most 18 when it has two such aromatic rings, and at most 6 when it has no aromatic ring.

In a case where Q is a bivalent organic group, Q preferably has an aromatic ring. In such a case, the moiety on the R side is preferably —CH$_2$O— or —COO— bonded to the aromatic ring. The moiety on the V side is the connecting bond of the aromatic ring or an alkylene group bonded to the aromatic ring, and the number of carbon atoms in such an alkylene group is preferably at most 4, particularly preferably 1 or 2. V is preferably a vinyl group, an allyl group, a (meth)acryloyloxy group, a vinyloxy group or an allyloxy group, directly bonded to the aromatic ring, or a (meth)acryloyloxy group bonded to the aromatic ring by means of the above alkylene group. V is particularly preferably a vinyl group or a (meth)acryloyloxy group, directly bonded to the aromatic ring, or a (meth)acryloyloxy group bonded to the aromatic ring by means of a methylene group or a dimethylene group.

In a case where Q has the aromatic ring, the aromatic ring may be a monocyclic aromatic ring, a condensed aromatic ring or a connected polycyclic aromatic ring. The aromatic ring may, for example, be a benzene ring, a naphthalene ring, a benzofurane ring, a benzimidazole ring, a benzoxazole ring or an anthracene ring, and is preferably a benzene ring in view of the cost. Further, at least one of hydrogen atoms on the aromatic ring may be substituted by a $C_{1-15}$ alkyl group or a halogen atom. The number of carbon atoms in the alkylene group as the substituent is preferably at most 4, and the halogen atom is preferably a fluorine atom or a chlorine atom.

The aromatic ring in Q is preferably bivalent (i.e. has two connecting bonds), and in a case where Q has a plurality of aromatic rings, each of them is preferably a bivalent aromatic ring. The aromatic ring in Q is preferably a phenylene group or a polyphenylene group having two or three phenylene groups connected. In the case of a polyphenylene group, the plurality of phenylene groups may be directly bonded or may be bonded by means of a linking group. The linking group is preferably a $C_{1-4}$ alkylene group, —O—, —OCH$_2$—, —CO—, —SO$_2$—, —S— or the like, particularly preferably —OCH$_2$—. In a case where the aromatic ring is a polyphenylene group, it is preferred that V and R are bonded to different aromatic rings.

In a case where Q is a bivalent organic group having no aromatic ring, Q is preferably —$R^{12}$—O— or —$R^{12}$—COO— (wherein $R^{12}$ is an alkylene group or a cycloalkylene group each having at most 10 carbon atoms).

In a case where Q is an organic group having an aromatic ring, Q is preferably a bivalent group represented by —(CH$_2$)$_m$—Ar—(Y—Ar)$_n$—X—. Ar is an aromatic ring which may have a $C_{1-15}$ alkylene group or a halogen atom, X is —CH$_2$O— or —COO—, Y is a single bond, —OCH$_2$—, —CH$_2$O—, a $C_{1-4}$ alkylene group, —O—, —OCH$_2$—, —CO—, —SO$_2$— or —S—, m is an integer of from 0 to 4, and n is 0 or 1.

The above Ar is preferably a phenylene group which may have a $C_{1-4}$ alkyl group or a halogen atom, particularly preferably a phenylene group having no substituent. Y is preferably —OCH$_2$— or —CH$_2$O—. The monomer (4) having such Q is preferably a compound represented by the following formula (5):

$$V—(CH_2)_m—Ar—(Y—Ar)_n—X—R^1—Cf \quad (5)$$

wherein V and Cf are the same groups as in the formula (4), and $R^1$ is a single bond or a $C_{1-10}$ alkylene group.

The monomer (4) is preferably a compound represented by the formula (4-1), (4-2), (4-3), (4-4) or (4-5). The compounds represented by the formulae (4-2) to (4-5) are respectively a part of the compound represented by the above formula (5):

$$V^1—R^1—Cf^1 \quad (4\text{-}1)$$

$$V^2\text{-Ph-}X—R^1—Cf^1 \quad (4\text{-}2)$$

$$V^1—(CH_2)_k\text{-Ph-}X—R^1—Cf^1 \quad (4\text{-}3)$$

$$V^2\text{-Ph-}Y^1\text{-Ph-}X—R^1—Cf^1 \quad (4\text{-}4)$$

$$V^1—(CH_2)_k\text{-Ph-}Y^1\text{-Ph-}X—R^1—Cf^1 \quad (4\text{-}5)$$

wherein
$Cf^1$: a $C_{2-15}$ perfluoroalkyl group,
$V^1$: a (meth)acryloyloxy group,
$V^2$: a vinyl group or a (meth)acryloyloxy group,
$R^1$: a single bond or a $C_{1-10}$ alkylene group,
Ph: a phenylene group,
X: —CH$_2$O— or —COO—,
$Y^1$: —OCH$_2$— or —CH$_2$O—, and
k: 1 or 2.

In a case where the Cf group present in a side chain in the copolymer (C) is a linking group having X and is bonded to the main chain, the linking group is likely to decompose the carbon atom of the main chain and the Cf group in the presence of light and/or ozone, so that a decomposition residue containing the Cf group is likely to leave from the copolymer (C). In a case where the Cf group further has the above $Y^1$ in addition to X, the linking group is likely to undergo a decomposition reaction in the presence of light and/or ozone and as a result, the decomposition residue containing the Cf group is more likely to leave from the main chain of the copolymer (C).

Therefore, by irradiating the cured film of the curable composition of the present invention with light or by bringing it into contact with ozone, the Cf group leaves from the surface of the cured film, the liquid repellency on the surface of the cured film is decreased, and the surface of the cured film is relatively lyophilic. By utilizing such characteristics, it is possible to form a pattern of a liquid repellent portion and a lyophilic portion on the surface of the cured film e.g. by irradiating the surface of the cured film with light by means of a mask pattern.

In the case of carrying out light irradiation or ozone treatment on the surface of the cured film as mentioned above, the cured film is preferably a cured film formed by thermally curing the curable composition of the present invention. Accordingly, the copolymer (C) having units (c1) having a linking group having X is preferably used as blended with the curable composition to be thermally cured.

The monomer (c1 m) other than the above-mentioned monomer may be a reaction product of a monoepoxide having a Cf group and (meth)acrylic acid, a reaction product of a monocarboxylic acid having a Cf group and a hydroxyalkyl (meth)acrylate, a reaction product of a monosulfonic acid having a Cf group and a hydroxyalkyl(meth)acrylate, or the like. For example, by reaction of a compound having a perfluoroalkyl group and a glycidyl group with (meth)acrylic acid, a compound having a hydroxyalkyl group having a perfluoroalkyl group bonded, and a (meth)acryloyloxy group bonded, is obtained.

The compound represented by the formula (4-1) may be
CH$_2$=CHCOOCH$_2$CF$_3$, CH$_2$=CCH$_3$COOCH$_2$CF$_3$,
CH$_2$=CHCOOCH$_2$CF$_2$CF$_3$,
CH$_2$=CCH$_3$COOCH$_2$CF$_2$CF$_3$, CH$_2$=CHCOOCH(CF$_3$)$_2$,
CH$_2$=CCH$_3$COOCH(CF$_3$)$_2$, CH$_2$=CHCOOCH$_2$(CF$_2$)$_2$CF$_3$,
CH$_2$=CCH$_3$COOCH$_2$(CF$_2$)$_2$CF$_3$,
CH$_2$=CHCOOCH$_2$CH$_2$(CF$_2$)$_2$CF$_3$,
CH$_2$=CCH$_3$COOCH$_2$CH$_2$(CF$_2$)$_2$CF$_3$,
CH$_2$=CHCOOCH$_2$CH$_2$(CF$_2$)$_3$CF$_3$,
CH$_2$=CCH$_3$COOCH$_2$CH$_2$(CF$_2$)$_3$CF$_3$,
CH$_2$=CHCOOCH$_2$CH$_2$(CF$_2$)$_4$CF$_3$,
CH$_2$=CCH$_3$COOCH$_2$CH$_2$(CF$_2$)$_4$CF$_3$,
CH$_2$=CHCOOCH$_2$CH$_2$(CF$_2$)$_5$CF$_3$,
CH$_2$=CCH$_3$COOCH$_2$CH$_2$(CF$_2$)$_5$CF$_3$,
CH$_2$=CHCOOCH$_2$CH$_2$(CF$_2$)$_7$CF$_3$,
CH$_2$=CCH$_3$COOCH$_2$CH$_2$(CF$_2$)$_7$CF$_3$,
CH$_2$=CHCOOCH$_2$CH$_2$(CF$_2$)$_9$CF$_3$,
CH$_2$=CCH$_3$COOCH$_2$CH$_2$(CF$_2$)$_9$CF$_3$,
CH$_2$=CHCOOCH$_2$CH$_2$(CF$_2$)$_{11}$CF$_3$,
CH$_2$=CCH$_3$COOCH$_2$CH$_2$(CF$_2$)$_{11}$CF$_3$,
CH$_2$=CHCOOCH$_2$CH$_2$(CF$_2$)$_{15}$CF$_3$,
CH$_2$=CCH$_3$COOCH$_2$CH$_2$(CF$_2$)$_{15}$CF$_3$,
CH$_2$=CHCOOCH$_2$CF(CF$_3$)O(CF$_2$)$_5$CF$_3$,
CH$_2$=CCH$_3$COOCH$_2$CH$_2$CF(CF$_3$)O(CF$_2$)$_5$CF$_3$,
CH$_2$=CHCOOCH$_2$CF$_2$O(CF$_2$CF$_2$O)$_p$CF$_3$ (p is from 1 to 8),
CH$_2$=CCH$_3$COOCH$_2$CH$_2$CF$_2$O(CF$_2$CF$_2$O)$_p$CF$_3$ (p is from 1 to 8), CH$_2$=CHCOOCH$_2$CF(CF$_3$)O(CF$_2$CF(CF$_3$)O)$_q$C$_6$F$_{13}$ (q is from 1 to 4), CH$_2$=CCH$_3$COOCH$_2$CH$_2$CF(CF$_3$)O(CF$_2$CF(CF$_3$)O)$_q$C$_6$F$_{13}$ (q is from 1 to 4), CH$_2$=CHCOOCH$_2$CF(CF$_3$)O(CF$_2$CF(CF$_3$)O)$_r$C$_3$F$_7$ (r is an integer of from 1 to 5) or CH$_2$=CCH$_3$COOCH$_2$CH$_2$CF(CF$_3$)O(CF$_2$CF(CF$_3$)O)$_r$C$_3$F$_7$ (r is an integer of from 1 to 5).

The compound represented by the formula (4-2) may, for example, be a compound represented by the following formula (4-2a), a compound represented by the following formula (4-2b) or a compound represented by the following formula (4-2c):

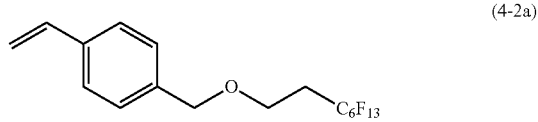

(4-2a)

(4-2b)

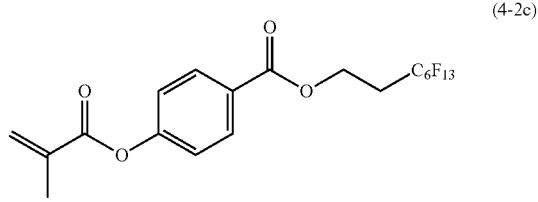

(4-2c)

The compound represented by the formula (4-3) may, for example, be a compound represented by the following formula (4-3a):

(4-3a)

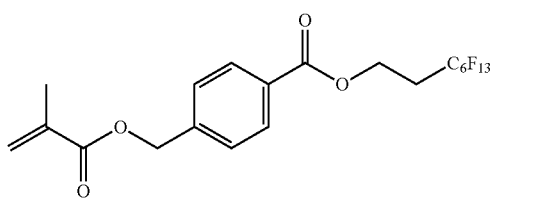

The compound represented by the formula (4-5) may, for example, be a compound represented by the following formula (4-5a):

(4-5a)

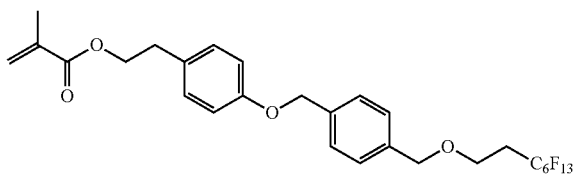

Particularly preferred as the monomer (c1m) is, in view of availability, $CH_2=CHCOOCH(CF_3)_2$, $CH_2=CCH_3COOCH(CF_3)_2$, $CH_2=CHCOOCH_2CH_2(CF_2)_3CF_3$, $CH_2=CCH_3COOCH_2CH_2(CF_2)_3CF_3$, $CH_2=CHCOOCH_2CH_2(CF_2)_5CF_3$ or $CH_2=CCH_3COOCH_2CH_2(CF_2)_5CF_3$. Further, with a view to promoting decomposition in the presence of light and/or ozone, particularly preferred is a compound represented by the formula (4-2a), (4-2b), (4-2c), (4-3a) or (4-5a).

The fluorine content in the copolymer (C) is preferably from 5 to 60 mass %, particularly preferably from 8 to 40 mass %. When the fluorine content is at least the lower limit of the above range, a favorable liquid repellency on the surface of the cured film will easily be obtained, and when it is at most the upper limit of the above range, a favorable adhesion between the cured film and a layer adjacent thereto will easily be obtained.

The proportion of the units (c1) in the copolymer (C) is preferably from 10 to 90 mass %, more preferably from 15 to 90 mass %, particularly preferably from 20 to 85 mass %. When it is at least the lower limit of the above range, a favorable liquid repellency on the surface of the cured film will easily be obtained, and when it is at most the upper limit of the above range, the curable composition is easily dissolved in a solvent.

The unit (c2) has a crosslinkable functional group. The unit (c2) has no Cf group and has no polyarylene structure. The number of the crosslinkable functional group in the unit (c2) is preferably 1. The crosslinkable functional group in the unit (c2) is particularly preferably a (meth)acryloyol group or a (meth)acryloyloxy group. As mentioned above, the crosslinkable functional groups of the compound (B) and the crosslinkable functional groups of the copolymer (C) may be the same or different.

As the unit (c2) is derived from a monomer, a polymerizable group which the monomer has (a group of the same type as the crosslinkable functional group) is lost by polymerization, and usually the crosslinkable functional group in the unit (c2) is not a functional group which the monomer has. Accordingly, usually, the crosslinkable functional group in the unit (c2) is a crosslinkable functional group introduced after formation of the copolymer.

The units (c2) having a crosslinkable functional group in the copolymer (C) are preferably introduced into the copolymer (C) by various modification methods of reacting a compound having a crosslinkable functional group with a polymer having a reactive moiety. Such modification methods may properly be selected from known methods. Specifically, a monomer having a reactive functional group (hereinafter referred to as monomer (c4m)) is copolymerized to produce a copolymer having reactive functional groups, and a compound (hereinafter referred to as compound (c2c)) having a second reactive functional group which reacts with and is bonded to the reactive functional group of the obtained copolymer, and a crosslinkable functional group, is reacted to produce the copolymer (C). The unit (c2) is a unit formed by bonding of the unit (c4) formed by polymerization of the monomer (c4m) and the compound (c2c).

As a specific modification method, the following methods may, for example, be mentioned. (i) A method of reacting an acid anhydride having a crosslinkable functional group with a copolymer obtained by copolymerizing a monomer having a hydroxy group, (ii) a method of reacting a compound having an isocyanate group and a crosslinkable functional group with a copolymer obtained by copolymerizing a monomer having a hydroxy group, (iii) a method of reacting a compound having an acyl chloride group and a crosslinkable functional group with a copolymer obtained by copolymerizing a monomer having a hydroxy group, (iv) a method of reacting a compound having a hydroxy group and a crosslinkable functional group with a copolymer obtained by copolymerizing an acid anhydride having a polymerizable group, (v) a method of reacting a compound having an epoxy group and a crosslinkable functional group with a copolymer obtained by copolymerizing a monomer having a carboxy group, or (vi) a method of reacting a compound having a carboxy group and a crosslinkable functional group with a copolymer obtained by copolymerizing a monomer having an epoxy group.

In a case where the compound (c2c) is reacted with the copolymer having the units (c4), the compound (c2c) may be reacted with substantially all the reactive functional groups in the copolymer or may be reacted with a part of the reactive functional groups in the copolymer. In the latter case, the obtainable copolymer (C) has units (c4) formed by polymerization of the monomer (c4m). The copolymer (C) to be used for the curable composition may have such units (c4). Further, in a case where the reactive functional group of the unit (c4) may adversely affect the curable composition, the reactive functional group may be converted to an inert group by reacting a compound having a second functional group which reacts with and is bonded to the reactive functional group of the copolymer and having no crosslinkable functional group, with the reactive functional group of the unit (c4).

The unit (c4) remaining in the copolymer (C) and a unit having the above-mentioned inert group derived therefrom, are considered as the after-mentioned units (c3).

The monomer having a hydroxy group in the above (i), (ii) and (iii) and the compound having a hydroxy group and a crosslinkable functional group in (iv) may, for example, be 2-hydroxyethyl(meth)acrylate or 4-hydroxybutyl(meth)acrylate.

The acid anhydride having a crosslinkable functional group in the above (i) and the acid anhydride having a polymerizable group in (iv) may, for example, be specifically maleic anhydride, itaconic anhydride, citraconic anhydride or phthalic anhydride.

The compound having an isocyanate group and a crosslinkable functional group in the above (ii) may, for example, be specifically 2-(meth)acryloyloxyethyl isocyanate or 1,1-bis(acryloyloxymethyl)ethyl isocyanate.

The compound having an acyl chloride group and a crosslinkable functional group in the above (iii) may, for example, be specifically (meth)acryloyl chloride or 3-butenoyl chloride.

The monomer having a carboxy group in the above (v) and the compound having a carboxy group and a crosslinkable functional group in (vi) may, for example, be specifically (meth)acrylic acid.

The compound having an epoxy group and a crosslinkable functional group in the above (v) and the monomer having an epoxy group in (vi) may, for example, be glycidyl(meth)acrylate or 3,4-epoxycyclohexylmethyl acrylate.

Preferred as the unit (c2) is a unit formed by reacting a compound having an isocyanate group and a crosslinkable functional group with a copolymer obtained by copolymerizing a monomer having a hydroxy group, or a unit formed by reacting a compound having an acyl chloride group and a crosslinkable functional group with a copolymer obtained by copolymerizing a monomer having a hydroxy group. Particularly preferred is, in view of favorable reactivity with the prepolymer (A), a unit formed by reacting a compound selected from the group consisting of (meth)acryloyl chloride, 2-methacryloyloxyethyl isocyanate and 2-acryloyloxyethyl isocyanate, with a copolymer obtained by copolymerizing at least one monomer selected from the group consisting of 2-hydroxyethyl(meth)acrylate and 4-hydroxybutyl(meth)acrylate, as a monomer having a hydroxy group.

In a case where the copolymer (C) comprises the units (c1) and the units (c2), as a preferred proportion of the units (c2) in the copolymer (C), the content of the units (c1) is such an amount that the fluorine content in the copolymer (C) is within the above preferred range, and the rest is the units (c2).

In a case where the copolymer (C) comprises the units (c1), the units (c2) and units (c3), it is preferred that the content of the units (c1) is such an amount that the fluorine content in the copolymer (C) is within the above preferred range, the content of the units (c3) is within the after-mentioned preferred range, and the rest is the units (c2).

The proportion of the units (c2) in the copolymer (C) is preferably from 10 to 90 mass %, more preferably from 10 to 85 mass %, particularly preferably from 15 to 80 mass %. When it is at least the lower limit of the above range, a favorable reactivity with the prepolymer (A) and the compound (B) will be obtained, and when it is at most the upper limit of the above range, a favorable liquid repellency on the surface of the cured film will easily be obtained.

The copolymer (C) may have units (c3) other than the units (c1) having a Cf group and the units (c2) having a crosslinkable functional group as the case requires within a range not to impair the effect of improving the liquid repellency. As mentioned above, when the copolymer (C) has the units (c4) or units derived from the units (c4) having no crosslinkable functional group, such units are units (c3).

The units (c3) are preferably introduced into the copolymer (C) by polymerizing the monomer (c3m). They are also preferably introduced to the polymer by various modification methods of reacting an appropriate compound with the copolymer (C) having a reactive moiety. Now, the monomer (c3m) to give units (c3) will be described with reference to examples.

The monomer (c3m) to give the unit (c3) may be the above monomer (c4m), or a hydrocarbon type olefin, a vinyl ether, an isopropenyl ether, an allyl ether, a vinyl ester, an allyl ester, a (meth)acrylate, a (meth)acrylamide, an aromatic vinyl compound, a chloroolefin or a conjugated diene. Such compounds may have a functional group, and such a functional group may, for example, be a hydroxy group, a carbonyl group or an alkoxy group. They may be used alone or in combination of two or more.

The monomer (c3m) to give the unit (c3) may, for example, be specifically acrylic acid, methacrylic acid, methyl(meth)acrylate, ethyl(meth)acrylate, n-propyl(meth)acrylate, isopropyl(meth)acrylate, n-butyl(meth)acrylate, isobutyl(meth)acrylate, sec-butyl(meth)acrylate, t-butyl(meth)acrylate, n-pentyl(meth)acrylate, 3-methylbutyl(meth)acrylate, n-hexyl(meth)acrylate, 2-ethyl-n-hexyl(meth)acrylate, n-octyl(meth)acrylate, cyclohexyl(meth)acrylate, isobornyl(meth)acrylate, (1,1-dimethyl-3-oxobutyl)(meth)acrylate, 2-acetoacetoxyethyl(meth)acrylate, 2-methoxyethyl(meth)acrylate, 2-ethoxyethyl(meth)acrylate, (meth)acrylamide, N-vinylacetamide, N-vinylformamide, N-(1,1-dimethyl-3-oxobutyl)(meth)acrylamide, N-methoxymethyl(meth)acrylamide or N,N-bis(methoxymethyl)(meth)acrylamide. In view of availability, preferred is acrylic acid, methacrylic acid, cyclohexyl(meth)acrylate or isobornyl(meth)acrylate.

The proportion of the units (c3) in the copolymer (C) is preferably at most 70 mass %, more preferably at most 50 mass %, particularly preferably at most 20 mass %. The lower limit is preferably 0%. When the proportion of the units (c3) is within the above range, sufficient contents of the units (c1) and the units (c2) will be secured, and the liquid repellency on the surface of the cured film and the curing property of the curable composition will not be impaired.

Preferred combinations of the units in the copolymer (C) are as follows. In the following, ($-CH_2-C-$) represents a moiety of two carbon atoms constituting the main chain.

(Combination 1)
unit (c1): ($-CH_2-C-$)$CH_3COOCH_2CH_2(CF_2)_5CF_3$
unit (c2): ($-CH_2-C-$)$CH_3COOCH_2CH_2OCONHCH_2CH_2OCOCH=CH_2$
unit (c3): ($-CH_2-C-$)$CH_3COOH$ (Combination 2)
unit (c1): ($-CH_2-C-$)$CH_3COOCH(CF_3)_2$
unit (c2): ($-CH_2-C-$)$CH_3COOCH_2CH_2OCONHCH_2CH_2OCOCH=CH_2$ (Combination 3)
unit (c1): ($-CH_2-C-$)$CH_3COOCH_2CH_2(CF_2)_3CF_3$
unit (c2): ($-CH_2-C-$)$CH_3COOCH_2CH_2OCONHCH_2CH_2OCOCH=CH_2$ (Combination 4)
unit (c1): ($-CH_2-C-$)$CH_3COOCH_2CH_2(CF_2)_5CF_3$
unit (c2): ($-CH_2-C-$)$CH_3COOCH_2CH_2OCONHCH_2CH_2OCOCH=CH_2$ (Combination 5)
unit (c1): unit derived from a compound represented by the formula (4-2b)
unit (c2): ($-CH_2-C-$)$CH_3COOCH_2CH_2OCONHCH_2CH_2OCOCH=CH_2$ (Combination 6)
unit (c1): unit derived from a compound represented by the formula (4-2a)
unit (c2): ($-CH_2-C-$)$CH_3COOCH_2CH_2OCONHCH_2CH_2OCOCH=CH_2$ The preferred weight ratio of the units in the copolymer (C) is preferably such that the units (c1):the units (c2):the units (c3)=10 to 90:10 to 90:0 to 70, more preferably 15 to 90:10 to 85:0 to 50, particularly preferably 20 to 90:10 to 80:0 to 20. The charge weight ratio of the monomer which gives the units (c1), the monomer and the reactive compound which give the units (c2), and the monomer which gives the units (c3), at the time of polymerization, is also the same.

Preparation of the copolymer (C) is preferably carried out in a solvent. The solvent may, for example, be an alcohol such as ethanol, 1-propanol, 2-propanol, 1-butanol or ethylene glycol; a ketone such as acetone, methyl isobutyl ketone or cyclohexanone; a cellosolve such as 2-methoxyethanol, 2-ethoxyethanol or 2-butoxyethanol; a carbitol such as 2-(2-methoxyethoxy)ethanol, 2-(2-ethoxyethoxy)ethanol or 2-(2-butoxyethoxy)ethanol; an ester such as methyl acetate, ethyl acetate, n-butyl acetate, ethyl lactate, n-butyl lactate, ethylene glycol monomethyl ether acetate, propylene glycol monomethyl ether acetate, ethylene glycol diacetate or glycerin triacetate; or an ether such as diethylene glycol dimethyl ether or diethylene glycol methyl ethyl ether. They may be used alone or in combination of two or more.

Further, a polymerization initiator is preferably used. The polymerization initiator may, for example, be a known organic peroxide, inorganic peroxide or azo compound. The organic peroxide or the inorganic peroxide may be used as a redox catalyst in combination with a reducing agent. Such polymerization initiators may be used alone or in combination of two or more.

The organic peroxide may, for example, be benzoyl peroxide, lauroyl peroxide, isobutyryl peroxide, t-butyl hydroperoxide or t-butyl-α-cumyl peroxide.

The inorganic peroxide may, for example, be ammonium persulfate, sodium persulfate, potassium persulfate, hydrogen peroxide or a percarbonate.

The azo compound may, for example, be 2,2'-azobisisobutylonitrile, 1,1-azobis(cyclohexane-1-carbonitrile), 2,2'-azobis(2,4-dimethylvaleronitrile), 2,2'-azobis(4-methoxy-2,4-dimethylvaleronitrile), dimethyl 2,2'-azobisisobutyrate or 2,2'-azobis(2-amidinopropane)dihydrochloride.

As the case requires, a chain transfer agent such as a mercaptan or a halogenated alkyl is preferably used.

The mercaptan may, for example, be n-butyl mercaptan, n-dodecyl mercaptan, t-butyl mercaptan, ethyl thioglycolate, 2-ethylhexyl thioglycolate or 2-mercaptoethanol. The halogenated alkyl may, for example, be chloroform, carbon tetrachloride or carbon tetrabromide. They may be used alone or in combination of two or more.

As the case requires, a known polymerization inhibitor is preferably blended. The polymerization inhibitor may, for example, be 2,6-di-t-butyl-p-cresol.

In a case where the obtained copolymer is modified also, the same solvent as above may be used. However, a solvent which may react with the compound (c2c) cannot be used. Preparation of the copolymer is carried out in a solvent, then the compound (c2c) is added and reacted to obtain the copolymer (C).

Further, modification may be carried out in the presence of a catalyst or a neutralizing agent. For example, in a case where a compound having an isocyanate group and a crosslinkable functional group is reacted with a copolymer having hydroxy groups, a tin compound or the like may be used as the catalyst. The tin compound may, for example, be dibutyltin dilaurate, dibutyltin di(maleic monoester), dioctyltin dilaurate, dioctyltin di(maleic monoester) or dibutyltin diacetate. They may be used alone or in combination of two or more.

In a case where a compound having an acyl chloride group and a crosslinkable functional group is reacted with a copolymer having hydroxy groups, a basic catalyst may be used. The basic catalyst may, for example, be triethylamine, pyridine, dimethyl aniline or tetramethylurea. They may be used alone or in combination of two or more.

The number average molecular weight (Mn) of the copolymer (C) is preferably from 1,000 to 50,000, particularly preferably from 3,000 to 20,000. When the number average molecular weight is at least the lower limit of the above range, the copolymer (C) will sufficiently migrate to the surface of a coating film, whereby a liquid repellency will be obtained. When it is at most the upper limit of the above range, the compatibility with the prepolymer (A) in the curable composition will be favorable, and a coating film free from defects will be formed.

The content of the copolymer (C) contained in the curable composition is preferably from 0.1 to 20 parts by mass, particularly preferably from 0.2 to 15 parts by mass based on the total amount (100 parts by mass) of the prepolymer (A) and the compound (B). When the content of the copolymer (C) is at least the lower limit of the above range, a sufficient effect of improving the liquid repellency will easily be obtained. When it is at most the upper limit of the above range, an obtainable film will have favorable physical properties.

<Application of Copolymer (C)>

Among the copolymers (C), a copolymer (hereinafter referred to as a copolymer (C-5)) having units (hereinafter referred to as units (c1-5)) having a monomer represented by the above formula (5) polymerized and the units (c2) and optionally the units (c3) is a copolymer useful for another application due to its specific characteristics. That is, by having a linking group containing —CH$_2$O— or —COO— bonded to the aromatic ring, the Cf group present in the side chain of the copolymer is characterized in that it easily leaves from the copolymer. Accordingly, by light irradiation and/or ozone treatment on the surface of a cured product of a curable composition containing such a copolymer, the liquid repellency on the surface of the cured film is lowered, and the surface of the cured product is relatively lyophilic. Accordingly, the copolymer having the units (c1-5) and the units (c2) and optionally the units (c3) is not limited for the curable composition of the present invention and is useful as a liquid repellency-imparting agent to be blended in a radical-curable composition (a curable composition containing at least one compound having a curable functional group as a curable component). As described hereinafter, for example, the surface of a thermally cured product of a curable composition containing the liquid repellency-imparting agent is irradiated with light by means of a mask pattern, whereby the portion irradiated with light is converted to a lyophilic surface, thereby to obtain a surface having a pattern of a liquid-repellent portion and a lyophilic portion.

The surface of a cured product of a curable composition containing the copolymer (C-5) repels water and oil, and even if water, oil or the like is attached, such an attached matter will easily be removed from the surface. The attached matter is not limited to a liquid and may be a solid having an adherent surface. Accordingly, the copolymer (C-5) has, as a component in a curable composition, a property to impart characteristics to reduce the adhesion or characteristics to make removal of the attached matter easy, to the surface of the cured product of the curable composition. For example, when an oily substance such as sebum is attached (particularly when fingerprints are attached) to the surface of the cured product, the attached matter can easily be removed. In a case where such characteristics are to be utilized also, as mentioned above, a surface having such characteristics partially lowered may be formed as mentioned above.

In the present invention, including the above liquid repellency-imparting agent, an agent which imparts characteristics to impart non-adhesion of a liquid or a solid to the surface will be referred to as a non-adhesion imparting agent.

In the curable composition containing the copolymer (C-5), the curable component other than the copolymer (C-5) is preferably the compound (B) or a compound having a crosslinkable functional group equivalent thereto (for example, a compound having one crosslinkable functional group). The crosslinkable functional group of such compounds is preferably a (meth)acryloyl(oxy) group, more preferably a (meth)acryloyloxy group, particularly preferably an acryloyl group or an acryloyloxy group.

<Radical Polymerization Initiator (D)>

The curable composition of the present invention may be thermally curable or photocurable. In a case where it is thermally curable, a thermal initiator (D1) is incorporated in the curable composition as a radical polymerization initiator (D), and in a case where it is photocurable, a photoinitiator (D2) is incorporated.

The photocurable composition may be used as a negative photosensitive material.

<Photoinitiator (D1)>

The thermal initiator (D1) may be known one. It may, for example, be azobisisobutylonitrile, benzoyl peroxide, tert-butyl hydroperoxide, cumene hydroperoxide, di-tert-butyl peroxide or dicumyl peroxide. They may be used alone or in combination of two or more.

In view of the decomposition temperature, azobisisobutylonitrile or benzoyl peroxide is preferred.

The content of the thermal initiator (D1) in the curable composition is preferably from 1 to 20 parts by mass, particularly preferably from 5 to 15 parts by mass based on the total amount (100 parts by mass) of the prepolymer (A) and the compound (B). When it is at least the lower limit of the above range, a sufficient effect of improving the curing property when cured at low temperature will be obtained, and the solvent resistance of the cured film will sufficiently be improved. When it is at most the upper limit of the above range, the storage stability of the curable composition will be favorable.

<Photoinitiator (D2)>

The photoinitiator (D2) may be known one for a photocurable composition. It may, for example, be specifically an oxime ester derivative such as 1,2-octanedione, 1-[4-(phenylthio)-, 2-(o-benzoyloxime)] (for example, tradename: IRGACURE OXE01), or ethanone 1-[9-ethyl-6-(2-methylbenzoyl)-9H-carbazol-3-yl], 1-(o-acetyloxime) (for example, tradename: IRGACURE OXE02); an α-aminoalkylphenone compound such as IRGACURE 369 (tradename) or IRGACURE 907 (tradename); or an acylphosphine oxide compound such as DAROCUR TPO (tradename) (each manufactured by Ciba Specialty Chemicals).

In view of the reactivity of a radical generated, preferred is IRGACURE OXE01 or IRGACURE OXE02.

The content of the photoinitiator (D2) in the curable composition is preferably from 1 to 20 parts by mass, particularly preferably from 3 to 15 parts by mass, based on the total amount (100 parts by mass) of the prepolymer (A) and the compound (B). When it is at least the lower limit of the above range, a sufficient effect of improving the curing property when cured at low temperature will be obtained, and the solvent resistance of the cured film will sufficiently be improved. When it is at most the upper limit of the above range, the storage stability of the curable composition will be favorable.

<Additives>

To the curable composition, an additive selected from various additives well known in the coating field, for example, stabilizers such as an ultraviolet absorber, an antioxidant and a thermal polymerization inhibitor; surfactants such as a leveling agent, a defoaming agent, a precipitation-preventing agent and a dispersant; plasticizers; and thickeners, may be incorporated, as the case requires, within a range not to impair the effects of the present invention.

Further, in a case where the cured film is a material remaining as a functional component in a final product without being removed during the production process (hereinafter referred to as a component material), for example, like an interlayer insulating film, an adhesion-improving agent such as a silane coupling agent may be incorporated to the curable composition. It is preferred to incorporate an adhesion-improving agent to the curable composition, since the adhesion between the cured film of the curable composition and a layer adjacent thereto will be improved. Otherwise, the adhesion can be improved also by a method of preliminarily applying an adhesion-improving agent to the adjacent layer.

The content of the additive in the curable composition is preferably from 0.0001 to 30 parts by mass, more preferably from 0.0001 to 20 parts by mass, particularly preferably from 0.0001 to 10 parts by mass based on the total amount (100 parts by mass) of the prepolymer (A) and the compound (B).

<Solvent>

As the curable composition of the present invention contains the compound (B) which is usually liquid, the compound (B) functions as a solvent, and the curable composition can be formed into a coating composition which can be applied. Further, the lower the viscosity of the compound (B), or the larger the amount of the compound (B) blended, the lower the viscosity of the curable composition of the present invention. However, it is difficult to make the composition have a viscosity so low that sufficient application is possible only by the curable composition of the present invention in many cases. Accordingly, usually, it is preferred to add a solvent to the curable composition of the present invention to form a coating composition.

The coating composition is applied on a substrate, and the solvent is removed, whereby a film of the curable composition of the present invention is formed. Usually, removal of the solvent is carried out by evaporating the solvent from the film of the coating composition. Accordingly, the solvent is required to have a boiling point lower than those of the components of the curable composition of the present invention. Among the components of the curable composition of the present invention, the compound having the lowest boiling point is usually the compound (B), and accordingly as the solvent, a solvent having a boiling point lower than that of the compound (B) in the curable composition is used. On the other hand, as the compound (B) in the curable composition of the present invention, it is preferred to use a compound having a boiling point sufficiently higher than those of solvents commonly used.

The solvent may be known one. It may, for example, be specifically propylene glycol monomethyl ether acetate (hereinafter referred to as PGMEA), mesitylene, N,N-dimethylacetamide, cyclohexanone or tetrahydrofuran.

The content of the solvent in the coating composition is preferably from 100 to 5,000 parts by mass, particularly preferably from 100 to 3,000 parts by mass based on the total amount (100 parts by mass) of the prepolymer (A) and the compound (B).

<Curable Composition>

As the curable composition and the coating composition of the present invention, the following combinations are preferred.

(Combination 1)

Curable Composition 1

A curable composition comprising:

Prepolymer (A): a prepolymer comprising perfluorobiphenyl, 1,3,5-trihydroxybenzene and acetoxystyrene in an amount of from 40 to 90 parts by mass based on the total amount (100 parts by mass) of the prepolymer (A) and the compound (B), Compound (B): at least one member selected from the group consisting of ethoxylated isocyanuric acid triacrylate, 1,10-decanediol diacrylate, 1,9-nonanediol diacrylate, 1,9-nonanediol dimethacrylate, trimethylolpropane triacrylate, dipentaerythritol hexaacrylate, pentaerythritol tetraacrylate, ditrimethylolpropane tetraacrylate and tricyclodecane dimethanol diacrylate in an amount of from 10 to 60 parts by mass based on the total amount (100 parts by mass) of the prepolymer (A) and the compound (B), Copolymer (C): a copolymer obtained by reacting a copolymer obtained by copolymerizing, as a monomer having a Cf group which gives the units (c1), a (meth)acrylate of an alkanol (number of carbon atoms: 2 to 4 excluding a perfluoroalkyl group) having a perfluoroalkyl group (number of carbon atoms: 2 to 10), or a compound represented by the formula (4-2a), (4-2b), (4-2c), (4-3a) or (4-5a); as the monomer (c4m), at least one member selected from the group consisting of 2-hydroxyethyl(meth)acrylate and 4-hydroxybutyl(meth)acrylate; and as the monomer (c3m), (meth)acrylic acid, with at least one member selected from the group consisting of (meth)acryloyl chloride, 2-methacryloyloxyethyl isocyanate and 2-acryloyloxyethyl isocyanate as the compound (c2c) in an amount of from 0.1 to 20 parts by mass based on the total amount (100 parts by mass) of the prepolymer (A) and the compound (B), and Photoinitiator (D1): at least one member selected from the group consisting of benzoyl peroxide and 2,2'-azobisisobutylonitrile in an amount of from 3 to 10 parts by mass based on the total amount (100 parts by mass) of the prepolymer (A) and the compound (B).

Coating Composition 1

A coating composition comprising the curable composition 1 and a solvent (at least one member selected from the group consisting of PGMEA and cyclohexanone) in an amount of from 100 to 3,000 parts by mass based on the total amount (100 parts by mass) of the prepolymer (A) and the compound (B).

(Combination 2)

Curable Composition 2

A curable composition comprising:

Prepolymer (A): a prepolymer comprising perfluorobiphenyl, 1,3,5-trihydroxybenzene and acetoxystyrene in an amount of from 40 to 90 parts by mass based on the total amount (100 parts by mass) of the prepolymer (A) and the compound (B), Compound (B): at least one member selected from the group consisting of ethoxylated isocyanuric acid triacrylate, 1,10-decanediol diacrylate, 1,9-nonanediol diacrylate, 1,9-nonanediol dimethacrylate, trimethylolpropane triacrylate, dipentaerythritol hexaacrylate, pentaerythritol tetraacrylate, ditrimethylolpropane tetraacrylate and tricyclodecane dimethanol diacrylate in an amount of from 10 to 60 parts by mass based on the total amount (100 parts by mass) of the prepolymer (A) and the compound (B), Copolymer (C): a copolymer obtained by reacting a copolymer obtained by copolymerizing, as a monomer having a fluoroalkyl group (Cf) which gives the units (c1), a (meth)acrylate of an alkanol (number of carbon atoms: 2 to 4 excluding a perfluoroalkyl group) having a perfluoroalkyl group (number of carbon atoms: 2 to 10); as the monomer (c4m), at least one member selected from the group consisting of 2-hydroxyethyl(meth)acrylate and 4-hydroxybutyl (meth)acrylate; and as the monomer (c3m), (meth)acrylic acid, with at least one member selected from the group consisting of (meth)acryloyl chloride, 2-methacryloyloxyethyl isocyanate and 2-acryloyloxyethyl isocyanate as the compound (c2c) in an amount of from 0.1 to 20 parts by mass based on the total amount (100 parts by mass) of the prepolymer (A) and the compound (B), and Photoinitiator (D2): at least one member selected from the group consisting of IRGACURE OXE01 and IRGACURE OXE02 in an amount of from 5 to 20 parts by mass based on the total amount (100 parts by mass) of the prepolymer (A) and the compound (B).

Coating Composition 2

A coating composition comprising the curable composition 2 and a solvent (at least one member selected from the group consisting of PGMEA and cyclohexanone) in an amount of from 100 to 3,000 parts by mass based on the total amount (100 parts by mass) of the prepolymer (A) and the compound (B) blended.

<Process for Producing Cured Film>

The process for producing a cured film of the present invention is a process for forming a film of the curable composition on a substrate, followed by curing. Here, "forming a film of the curable composition on a substrate" includes both a case where a film of the curable composition is directly formed on a substrate and a case where an optional layer is formed on a substrate, and a film of the curable composition is formed thereon. Further, in a case where a coating composition is used, it includes a case where a film of the coating composition is formed on a substrate, and then the solvent is removed to form a film of the curable composition. That is, a film of the coating composition is formed on a substrate, and the coating composition is cured by means of at least one heating step. Further, a film obtained by curing the film of the curable composition will be referred to as a cured film. It is preferred to use a coating composition with a view to obtaining a cured film having a uniform thickness.

The thickness of the cured film is not particularly limited and may optionally be selected. For example, the thickness is preferably at a level of from 0.1 to 100 µm, particularly preferably from 0.2 to 50 µm.

Forming of a film of the curable composition directly on a substrate or forming of a film of the coating composition on a substrate may be carried out by a known coating method such as a spin coating method, a dip coating method, a spray coating method, a die coating method, a bar coating method, a doctor coating method, an extrusion coating method, a scanning coating method, a brush coating method, a potting method, an inkjet method or printing. In view of uniform thickness, preferred is a spin coating method or a scan coating method.

In a case where curing is carried out by thermal curing, a film of the curable composition is formed on a substrate, followed by a heating step (curing step) to form a cured film. Before the curing step, a heating step (prebaking) may be carried out.

In a case where curing is carried out by photo-curing, a film of the curable composition is formed on a substrate, followed by a heating step (prebaking) as the case requires, the film is irradiated with light (exposed) and then as the case requires, a heating step (curing step) is carried out to obtain a cured film. In view of the cost, preferred is a method of forming a film of the curable composition on a substrate, followed by irradiation with light (exposure) to obtain a cured film. Preferred is a method of forming a film of the coating composition on a substrate, and removing the solvent by a heating step (prebaking) to form a film of the curable composition, followed by irradiation with light (exposure) to obtain a cured film. At the time of exposure, a photomask may be used.

The light to be applied is not particularly limited so long as it is light having a wavelength to which the photoinitiator (D2) contained in the curable composition is sensitive. Usually, light to be used for curing is ultraviolet light, but is not limited thereto.

In the case of carrying out microfabrication by means of photolithography, by selective irradiation with light (exposure), the irradiated portion (exposed portion) is cured. Accordingly, by carrying out development (a step to remove the non-exposed portion by being dissolved or dispersed in a solvent) after exposure to remove the non-exposed portion, and removing the solvent remaining in the cured portion, a microfabricated cured film is obtained. As the case requires, a heating step (curing step) may be carried out after development. In such a case, the remaining solvent can be removed in this heating step (curing step). Further, after exposure and before development, a heating step (post-exposure baking) may be carried out as the case requires.

In the present invention, production of the cured film can be carried out at a low temperature with a heating temperature in the heating step of at most 250° C. In such a case, when at least two heating steps are carried out, for example, prebaking and/or post-exposure baking and the curing step are carried out, the heating temperature in all the heating steps is at most 250° C. In a case where the substrate has a heat resistant temperature lower than 250° C., the heating temperature in the heating step is at most the heat resistant temperature of the substrate.

In the present invention, the heating temperature being at most 250° C. means that the temperature of an object to be heated will not exceed 250° C. Specifically, the temperature of a heating apparatus such as a hot plate or an oven is set to be at most 250° C.

In the process for producing a cured film of the present invention, prebaking is carried out for the purpose of removing the solvent when a coating composition is used, and is carried out at a relatively low heating temperature. The heating temperature in prebaking is not particularly limited and is preferably from 40 to 100° C. for example.

The curing step and the post-exposure baking are carried out for the purpose of curing the film, and are carried out at a relatively high heating temperature. The heating temperature in the curing step and the post-exposure baking is preferably at least 80° C., particularly preferably at least 100° C. If the temperature is lower than such a range, effects by the curing step or the post-exposure baking tend to be insufficient. Further, as shown in the after-mentioned Examples, with the curable composition of the present invention, a cured film with favorable solvent resistance can be obtained even when the heating temperature in the curing step and the post-exposure baking is from 100 to 150° C. The lower the heating temperature, the less the substrate will be damaged, such being favorable.

Accordingly, the heating step in the process for producing a cured film of the present invention is carried out preferably at a heating temperature of at most 200° C. In a case where at least two heating steps are carried out, the heating temperature in all the heating steps is at most 200° C. In a case where the substrate has a heat resistant temperature lower than 200° C., the heating temperature in the heating step is at most the heat resistant temperature of the substrate. Specifically, the temperature of a heating apparatus such as a hot plate or an oven is set to be at most 200° C.

The cured film in the present invention is preferably produced by using the coating composition at a temperature of at most 250° C. in all the heating steps included in the procedure to obtain the cured film. Further, even in the case of photo-curing, a step which requires heating to remove the solvent or for other purposes is required, and in such a heating step also, the heating temperature is preferably at most 250° C. Accordingly, the process for producing a cured film is preferably a process for producing a cured film, which comprises forming a film of the coating composition on a substrate, and thermally curing or photo-curing the curable composition by a step containing at least one heating step to produce the cured film, wherein the heating temperature in all the heating steps is at most 250° C.

The substrate to be used in the present invention may, for example, be a plastic, glass or silicon. For example, a plastic such as polycarbonate, polyethylene terephthalate, polyethylene naphthalate, polyethersulfone or polyimide is preferably used, whereby excellent mechanical flexibility will be obtained.

The application of the cured film obtainable by curing the curable composition of the present invention is preferably a functional film. The functional film is a film having a function such as electrical insulation, chemical or physical protection or non-adhesion on its surface, in semiconductor devices or other various electronic devices. Specifically, it may, for example, be an interlayer insulating film for flexible devices, a protective film for flexible devices, a gate insulating film for organic thin-film transistors, a gate insulating film for oxide thin-film transistors, a capacitor insulating film, a gate insulating film for memory transistors, passivation for semiconductors, a protective film for semiconductor devices, an interlayer insulating film for multilayer interconnection for high density mounting, an insulating layer for organic electroluminescent elements, an insulating film for rewiring, cover coating for copper-clad plates, a solder resist film, a liquid crystal alignment film, a protective film for color filters, a resin post for e.g. semiconductor devices, and partition walls for e.g. color filters.

The curable composition of the present invention, which comprises the prepolymer (A), the compound (B) and the radical polymerization initiator (D), can sufficiently be cured by heating at 250° C. or lower, preferably at 200° C. or lower. That is, as shown in the after-mentioned Examples and Comparative Examples, if the curable composition contains the prepolymer (A) and contains neither of the compound (B) and the radical polymerization initiator (D), by thermal curing (curing temperature: 150° C.), although a cured film is formed, the cured film will easily be dissolved in a solvent. Further, by photo-curing, no cured film will be formed, and the coating film will easily be dissolved in the development step.

Further, if the curable composition contains no compound (B) even though it contains the prepolymer (A) and the radical polymerization initiator (D), by thermal curing, although a cured film is formed, it will be swollen and its film thickness increases if it is immersed in a solvent, and the reduction in film thickness is significant after it is dried. In the case of photo-curing, the cured film will be swollen in a solvent and its film thickness increases, and its film thickness will return to the original thickness after it is dried.

Further, if the curable composition contains no radical polymerization initiator (D) even though it contains the prepolymer (A) and the compound (B), in the case of thermal curing, although a cured film is formed, the cured film will easily be dissolved in a solvent. Further, in the case of photo-curing, no cured film will be formed, and the coating film will easily be dissolved in the development step.

Whereas, when the curable composition contains the prepolymer (A), the compound (B) and the radical polymerization initiator (D), a low dielectric constant cured film having excellent solvent resistance will be obtained even by thermal curing or photo-curing under the same conditions as above.

The compound (B) is disclosed as a component to improve flatness of the film surface in the above Patent Document 4. However, it is a surprising finding that a combined use of the compound (B) and the radical polymerization initiator (D) in combination with the prepolymer (A), the curing property when the curable composition is cured at low temperature is improved, and the solvent resistance of the cured film is improved.

The reason why the curable composition can sufficiently be cured at low temperature by combination of the prepolymer (A), the compound (B) and the radical polymerization initiator (D) is not clearly understood, but is estimated that by the compound (B) which functions as a reactive diluent, the glass transition temperature of the coating film before curing will be lowered, and the reaction of radicals becomes possible even at low temperature, whereby curing proceeds.

Further, by the curable composition containing the copolymer (C) in addition to the prepolymer (A), the compound (B) and the radical polymerization initiator (D), an effect such that it can sufficiently be cured even without a heating step at high temperature and an effect such that the liquid repellency on the surface of the cured film can be improved without impairing an effect that a low dielectric constant cured film having excellent solvent resistance can be obtained. The reason why a favorable liquid repellency can be obtained is considered that the fluoroalkyl group (Cf) in the copolymer (C) contributes to an improvement in the liquid repellency and that the crosslinkable functional group undergoes a curing reaction to contribute to the stability and the lasting effect of the liquid repellency.

With respect to a film of the curable composition of the present invention using a copolymer having, as the units (c1) of the copolymer (C), units having a linking group having the above X such as the units (c1-5) (i.e. the above copolymer (C-5)), the surface of the cured film can be converted to be lyophilic by light irradiation or ozone treatment on the surface. Hereinafter this treatment to convert the surface of the cured film to be lyophilic will be referred to as lyophilic treatment, and a step for the lyophilic treatment will be referred to as a lyophilic step. The lyophilic treatment is preferably a treatment of applying light. Accordingly, the present invention further provides a method for treating a cured film, which comprises irradiating the cured film with light to lower the liquid repellency at the light irradiated portion.

The lyophilic treatment is preferably a treatment of irradiating the cured film formed by thermal curing with light. This exposure may be carried out under the same conditions as the conditions for photo-curing the curable composition of the present invention. For example, the surface of the cured film is irradiated with light such as ultraviolet light by means of a photomask to form a cured film having a pattern of a liquid repellent portion and a lyophilic portion formed on its surface.

When the lyophilic portion of the cured film formed by the lyophilic step is treated with a treating liquid in the following step, the treating liquid will adhere to the lyophilic portion and will not adhere to the liquid repellent portion. Accordingly, when an electric conductor-forming liquid or an electrode-forming liquid is used as the treating liquid for example, an electric conductor or an electrode can be formed only on the lyophilic portion. Thus, an electric conductor pattern or an electrode pattern can easily be formed on the cured film.

Here, the surface of a cured film formed by curing the curable composition of the present invention containing the above copolymer (C-5) as the copolymer (C) by light irradiation has a low liquid repellency as compared with the surface of the thermally cured film, by leaving of the Cf groups. However, even a cured film having a surface with a low liquid repellency can be used for applications except for an application for which a particularly high liquid repellent surface is required.

Process for Producing Semiconductor Device

First Embodiment

Formation of Cured Film

The cured film of the curable composition of the present invention is useful for production of a semiconductor device.

That is, a film of a coating composition containing the curable composition of the present invention is formed on a substrate, and then the curable composition is thermally cured or photo-cured by a step containing at least one heating step to produce a cured film, and a semiconductor device can suitably be produced by this process. The first heating step after the film of the coating composition is formed is usually a step for removing the solvent.

FIG. 1 is a view illustrating an example of the first embodiment of the process for producing an organic thin-film transistor by using a cured film obtainable by curing the curable composition of the present invention as a gate insulating film, and is a drawing schematically illustrating the cross-section of the device structure.

An organic thin-film transistor of this example comprises a substrate 1, and a gate electrode 2, a gate insulating film 3 and an organic semiconductor layer 4 formed in this order on the substrate 1, and a source electrode 5 and a drain electrode 6 further formed thereon.

The device structure of the organic thin-film transistor is various, and is not particularly limited so long as it has a gate insulating film obtainable by curing the curable composition of the present invention.

In FIG. 1, the reference symbol 1 represents a substrate. Its preferred material is the same as the material preferred as the above-described substrate.

The gate electrode 2, the source electrode 5 and the drain electrode 6 are formed by an electric conductor. The electric conductor to be used for such electrodes is not particularly limited and may, for example, be preferably silicon, doped silicon, platinum, gold, silver, copper, chromium, aluminum, calcium, barium, indium tin oxide, indium zinc oxide, zinc oxide, carbon black, a fullerene, carbon nanotubes, polythiophene, polyethylenedioxythiophene, polystyrene-sulfonic acid, polyaniline, polypyrrole or polyfluorene. These electrode materials may be used alone or in combination of two or more. Further, the materials of the gate electrode 2, the source electrode 5 and the drain electrode 6 may be the same or different.

The method for forming the electrode is not particularly limited and for example, sputtering, vacuum deposition, spin coating, spray coating, printing or ink jet may be applicable.

As the material of the organic semiconductor layer 4, a low molecular compound, an oligomer or a polymer may be used, and the material is not particularly limited. The low molecular compound may, for example, be pentacene, rubrene, phthalocyanine, perylene, fullerene or a derivative thereof.

The oligomer may, for example, be oligothiophene or a derivative thereof.

The polymer may, for example, be poly-p-phenylenevinylene (PPV), polyfluorene, a fluorene-benzothiazole copolymer, a fluorene-triphenylamine copolymer, a fluorenedithiophene copolymer, polythiophene, polyaniline, polyacetylene, polypyrrole or a derivative thereof.

The organic semiconductor layer 4 may be formed by forming a layer comprising a precursor of an organic semiconductor, and then applying light or heat to convert the precursor to an organic semiconductor. Such a convertible precursor material may, for example, be silylethyne-substituted pentacene or a tetrabicycloporphyrin derivative. Such a material, which can be converted to pentacene or a tetrabicycloporphyrin derivative by heating, is useful as a precursor material for the organic semiconductor layer.

The thickness of the organic semiconductor layer 4 is not particularly limited but is preferably from 5 nm to 100 μm, more preferably from 10 nm to 10 μm, particularly preferably from 10 nm to 1 μm.

The gate insulating film 3 may be formed by the above-described <Process for producing cured film> by using the coating composition containing the curable composition of the present invention. The thickness of the gate insulating film 3 comprising a cured film formed by curing by heat or light is not particularly limited, but the thickness t at a portion where no gate electrode 2 is present is preferably from 1 nm to 10 μm, more preferably from 2 nm to 5 μm, particularly preferably from 5 nm to 1 μm. If the thickness of the gate insulating film 3 is to thin, a leakage current is likely to occur between the gate electrode 6 and the source electrode 5, and if it is too thick, the driving voltage tends to increase.

With respect to an organic thin-film transistor thus obtained, the leakage current is reduced by forming the gate insulating film 3 by using the curable composition of the present invention. As it is possible to make the gate insulating film 3 thin, downsizing of the device can be realized, and further, the driving voltage of the transistor can be reduced.

For example, the coating composition in the after-mentioned Example 1 was applied to a low resistant silicon substrate by spin coating at 700 revolutions per minute for 30 seconds, heated on a hot plate at 150° C. for 2 minutes and then heated in an oven at 150° C. for 10 minutes to obtain a cured film having a thickness of 1.5 μm. The leakage current of the cured film was measured, whereupon the leakage current at 1.0 [MV/cm] was $2.9 \times 10^{-10}$ [A/cm$^2$].

Further, with respect to the organic thin-film transistor in this Example, as the surface of the gate insulating film 3 has a favorable liquid repellency, such effects will be obtained that molecules in the organic semiconductor layer 4 provided on the gate insulating film 3 are likely to be aligned, polar groups to be top sites of a carrier are less likely to be present on the surface, moisture and the like in the air are less likely to be adsorbed. Accordingly, the electron mobility in the organic thin-film transistor will be high, and the stability and the reliability will improve.

Second Embodiment

Lyophilic Treatment on Cured Film

With respect to the cured film of the curable composition of the present invention having the above specific copolymer (C-5) blended, as shown in the after-mentioned experimental examples, the liquid repellency can be lowered by irradiating the surface of the cured film with ultraviolet light or laser light. This can be suitably utilized for the process for producing a semiconductor device.

That is, a semiconductor device can suitably be formed by a process which comprises forming a cured film of the curable composition of the present invention on a substrate, and irradiating the cured film with ultraviolet light. The cured film can be formed by the method disclosed in the above first embodiment. However, the cured film is preferably a cured film formed by thermal curing.

Figure 2:
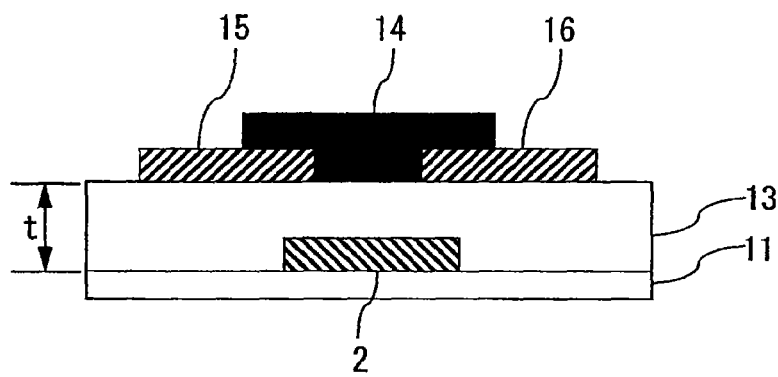
FIG. 2 is a cross-sectional view schematically illustrating another embodiment of an organic thin-film transistor using the cured film of the present invention.

FIG. 2 is a view illustrating an example of the second embodiment of the process for producing an organic thin-film transistor, and is a view schematically illustrating the cross-section of the device structure. The same constituent as in FIG. 1 is provided with the same symbol and its description is omitted.

The organic thin-film transistor in this example is significantly different from the example in FIG. 1 in that a source electrode 15 and a drain electrode 16 are formed on a gate insulating film 13.

In a case where the layer under the electrodes is a cured film of the specific curable composition of the present invention (a curable composition containing the above copolymer (C-5) as the copolymer (C)) as in this example, formation of a finer electrode is possible by carrying out patterning of selectively irradiating the surface of the layer under the electrodes with ultraviolet light or laser light to change the liquid repellency on a predetermined region.

Figure 3:
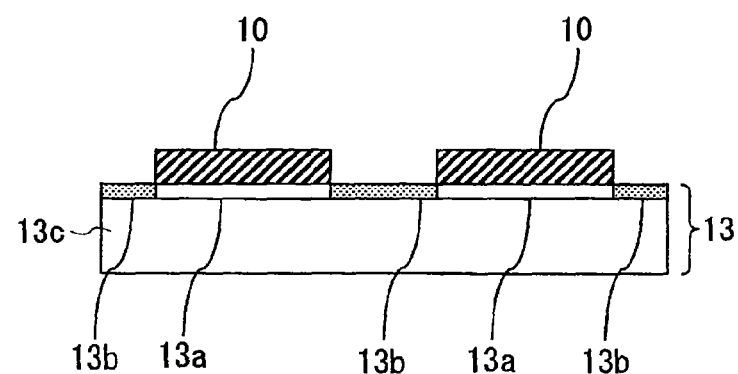
FIG. 3 is a cross-sectional view illustrating a pattern forming step in a process for producing the organic thin-film transistor shown in FIG. 2.

FIG. 3 is a view schematically illustrating the patterning step. That is, the cured film (gate insulating film 13) of the specific curable composition of the present invention is irradiated with ultraviolet light or laser light by means of a photomask, whereby at the outermost layer portion of the exposed portion, at least part of the Cf groups on the surface of the cured film leave and are removed from the surface of the cured film, and the portion is converted to a lyophilic region 13a. In FIG. 3, the reference symbol 13b represents a non-exposed portion and a liquid repellent region. In FIG. 3, the reference symbol 13c represents an internal region other than the outermost layer of the cured film (gate insulating film 13).

In the cured film (gate insulating film 13), it is estimated that the lyophilic region 13a and the liquid repellent region 13b are not clearly distinguished from the internal region 13c under such surface layers having surface properties, but the concentration of the Cf groups is continuously changed along the thickness direction.

In the patterning step, to draw the pattern, ultraviolet light or laser light may be employed. For example, an infrared laser, an ultraviolet lamp or electron irradiation of e.g. y rays is possible. The light source may, for example, be a mercury lamp, a metal halide lamp, a xenon lamp, a chemical lamp or a carbon-arc lamp. The radiation may, for example, be electron beam, X-ray or ion beam. As the laser, gas laser such as carbon dioxide laser, nitrogen laser, Ar laser, He/Ne laser, He/Cd laser or Kr laser, liquid laser, solid-state laser such as Nd/YAG laser, semiconductor laser, excimer laser or the like may be used.

Then, an electric conductor or a solution 10 containing an electric conductor, as the material of the source electrode 15 and the drain electrode 16 is applied, whereby the droplets are diffused in and applied to only the surface of the lyophilic region 13a, but they are not applied to the water-repellent region 13b which is the non-exposed portion. As a method of forming the source electrode 15 and the drain electrode 16, ink jet, a dispenser or printing may, for example, be used.

The gate insulating film 13 and the organic semiconductor layer 14 may be formed in the same manner as the gate insulating film 3 and the organic semiconductor layer 4 in the example shown in FIG. 1.

The organic thin-film transistor obtainable in this example also has the same effects as the organic thin-film transistor according to the above-described first embodiment (FIG. 1).

EXAMPLES

Now, the present invention will be described in further detail with reference to Examples. However, it should be understood that the present invention is by no means restricted to such specific Examples. The evaluation methods are as follows.

[Contact Angle]

The contact angle on the surface of a cured film was measured by using a contact angle meter CA-A (tradename) manufactured by Kyowa Interface Science Co., LTD. at 25° C. by means of a sessile drop method. To evaluate the water repellency, about 1 μL of water was dropped on the cured film to measure the contact angle, and to evaluate the oil repellency, about 1 μL of propylene glycol monomethyl ether acetate (PGMEA) was dropped to measure the contact angle.

[Relative Dielectric Constant]

The relative dielectric constant was measured by a mercury prober (manufactured by SSM, tradename: SSM-495) by carrying out CV measurement to determine the relative dielectric constant at 1 MHz.

[Solvent Resistance]

The thickness of a cured film was measured (thickness: $t_0$), and then the cured film was immersed in PGMEA at room temperature (from 20 to 25° C.) for one hour. Then, by using a spin coater, spin drying was carried out at 1,000 revolutions per minute for 30 seconds to measure the thickness (thickness: $t_1$). Then, the cured film was dried on a hot plate at 100° C. for 5 minutes and the thickness was measured (thickness: $t_2$). The swell ratio and the film remaining ratio were determined from the following formulae.

Swell ratio(%)=$(t_1-t_2)/t_0 \times 100$

Film remaining ratio(%)=$t_2/t_0 \times 100$

The solvent resistance of the cured film was evaluated based on the standards such that one which satisfies both a swell ratio of at most 5% and a film remaining ratio of at least 80%: "a cured film sufficiently cured, having favorable solvent resistance (represented by ○ in Tables)", one which satisfy either one of them: "a cured film insufficiently cured, having poor solvent resistance (represented by Δ in Tables)" and one which satisfies neither of them, or one which was not cured: "curing failure (represented by x in Tables)".

<Preparation of Fluorinated Polyarylene Prepolymer (A)>

Abbreviations represent the following compounds.
DMAc: N,N-dimethylacetamide
PFB: perfluorobiphenyl Preparation Example 1

Preparation of Fluorinated Polyarylene Ether Prepolymer (A1)

In DMAc (6,620 g) solvent, PFB (450 g), pentafluorophenylacetylene (155 g) and 1,3,5-trihydroxybenzene (130 g) were reacted in the presence of powdery molecular sieves 4 A (600 g) and sodium carbonate (600 g) at 60° C. for 45 hours to prepare prepolymer (A1). The obtained DMAc solution of prepolymer (A1) was poured into an aqueous hydrochloric acid solution (3.5 mass % aqueous solution) for purification by reprecipitation, followed by vacuum drying to obtain 620 g of powdery prepolymer (A1). The number average molecular weight (Mn) of prepolymer (A1) was 10,000.

Preparation Example 2

Preparation of Fluorinated Polyarylene Ether Prepolymer (A2)

In DMAc (492 g) solvent, pentafluorostyrene (22 g) and 1,1,1-tris(4-hydroxyphenyl)ethane (33 g) were reacted in the presence of sodium carbonate (51 g) at 60° C. for 24 hours, and then a solution having PFB (40 g) dissolved in DMAc (360 g) was added, followed by reaction at 60° C. further for 17 hours to prepare prepolymer (A2). The obtained DMAc solution of prepolymer (A2) was poured into an aqueous hydrochloric acid solution (3.5 mass % aqueous solution) for purification by reprecipitation, followed by vacuum drying to obtain 750 g of powdery prepolymer (A2). The number average molecular weight (Mn) of prepolymer (A2) was 10,000.

Preparation Example 3

Preparation of Fluorinated Polyarylene Ether Prepolymer (A3)

In DMAc (6.2 kg) solvent, PFB (650 g) and 1,3,5-trihydroxybenzene (120 g) were reacted in the presence of potassium carbonate (570 g) at 40° C. for 6 hours, and then 4-acetoxystyrene (200 g) was reacted in the presence of a 48 mass % potassium hydroxide aqueous solution (530 g) to prepare prepolymer (A3). The obtained DMAc solution of prepolymer (A3) was poured into an aqueous hydrochloric acid solution (3.5 mass % aqueous solution) for purification by reprecipitation, followed by vacuum drying to obtain 800 g of powdery prepolymer (A3). The number average molecular weight (Mn) of prepolymer (A3) was 10,000.

<Preparation of Copolymer (C)>

Abbreviations represent the following compounds.

[Monomer Having Fluoroalkyl Group (Cf)]
C6FMA: $CH_2$=$C(CH_3)COOCH_2CH_2(CF_2)_6F$
C4FMA: $CH_2$=$C(CH_3)COOCH_2CH_2(CF_2)_4F$
C8FA: $CH_2$=$CHCOOCH_2CH_2(CF_2)_4F$
iC3FMA: $CH_2$=$C(CH_3)COOCH(CF_3)_2$
Compound (4-2a): compound represented by the formula (4-2a)
Compound (4-2b): compound represented by the formula (4-2b)
Compound (4-2c): compound represented by the formula (4-2c)
Compound (4-3a): compound represented by the formula (4-3a)
Compound (4-5a): compound represented by the formula (4-5a)

[Monomer Having Carboxy Group]
MAA: methacrylic acid

[Monomer Having Hydroxy Group]
HEMA: 2-hydroxyethyl methacrylate
HBA: 4-hydroxybutyl acrylate

[Compound Having Isocyanate Group and Crosslinkable Group]
MOI: 2-methacryloyloxyethyl isocyanate
AOI: 2-acryloyloxyethyl isocyanate

[Compound Having Acyl Chloride Group and Crosslinkable Group]
AC: acryloyl chloride

[Chain Transfer Agent]
DSH: n-dodecylmercaptan

[Polymerization Initiator]
V-70: 2,2'-azobis(4-methoxy-2,4-dimethylvaleronitrile) (manufactured by Wako Pure Chemical Industries, Ltd.), tradename: V-70)

[Catalyst]
DBTDL: dibutyltin dilaurate
TEA: triethylamine

[Polymerization Inhibitor]
BHT: 2,6-di-t-butyl-p-cresol

Preparation Example 4

Preparation of Copolymer (C1)

In acetone (555 g) solvent, C6FMA (96 g), MAA (72 g) and HEMA (72 g) were reacted in the presence of a chain transfer agent DSH (9.7 g) and a polymerization initiator V-70 (5 g) at 40° C. for 18 hours to obtain a solution of polymer 1. The obtained acetone solution of polymer 1 was poured into water for purification by reprecipitation, followed by vacuum drying to obtain 230 g of powdery polymer 1.

Then, in acetone (100 g) solvent, polymer 1 (100 g), MOI (36 g), DBTDL (0.2 g) and BHT (1.8 g) were reacted at 30° C. for 18 hours to prepare copolymer (C1). The obtained acetone solution of copolymer (C1) was poured into water for purification by reprecipitation, followed by vacuum drying to obtain 135 g of powdery copolymer (C1). Of copolymer (C1), the fluorine content was 22 mass % and the number average molecular weight (Mn) was 7,000.

Preparation Example 5

Preparation of Copolymer (C2)

In acetone (100 g) solvent, polymer 1 (100 g) obtained in Preparation Example 4, AOI (33 g), DBTDL (0.2 g) and BHT (1.8 g) were reacted at 30° C. for 18 hours to prepare copolymer (C2). The obtained acetone solution of copolymer (C2) was poured into water for purification by reprecipitation, followed by vacuum drying to obtain 130 g of powdery copolymer (C2). Of copolymer (C2), the fluorine content was 22 mass % and the number average molecular weight (Mn) was 7,000.

Preparation Example 6

Preparation of Copolymer (C3)

In acetone (555 g) solvent, C4FMA (96 g), MAA (72 g) and HEMA (72 g) were reacted in the presence of a chain transfer agent DSH (9.7 g) and a polymerization initiator V-70 (5 g) at 40° C. for 18 hours to obtain a solution of polymer 2. The obtained acetone solution of polymer 2 was poured into water for purification by reprecipitation, followed by vacuum drying to obtain 230 g of powdery polymer 2.

Then, in acetone (100 g) solvent, polymer 2 (100 g), MOI (36 g), DBTDL (0.2 g) and BHT (1.8 g) were reacted at 30° C. for 18 hours to prepare copolymer (C3). The obtained acetone solution of copolymer (C3) was poured into water for purification by reprecipitation, followed by vacuum drying to obtain 132 g of powdery copolymer (C3). Of copolymer (C3), the fluorine content was 19 mass % and the number average molecular weight (Mn) was 7,000.

Preparation Example 7

Preparation of Copolymer (C4)

In acetone (555 g) solvent, C8FMA (96 g), MAA (72 g) and HEMA (72 g) were reacted in the presence of a chain transfer agent DSH (9.7 g) and a polymerization initiator V-70 (5 g) at 40° C. for 18 hours to obtain a solution of polymer 3. The obtained acetone solution of polymer 3 was poured into water for purification by reprecipitation, followed by vacuum drying to obtain 230 g of powdery polymer 3.

Then, in acetone (100 g) solvent, polymer 3 (100 g), MOI (36 g), DBTDL (0.2 g) and BHT (1.8 g) were reacted at 30° C. for 18 hours to prepare copolymer (C4). The obtained acetone solution of copolymer (C4) was poured into water for purification by reprecipitation, followed by vacuum drying to obtain 134 g of powdery copolymer (C4). Of copolymer (C4), the fluorine content was 24 mass % and the number average molecular weight (Mn) was 7,000.

Preparation Example 8

Preparation of Copolymer (C5)

In acetone (555 g) solvent, C6FMA (120 g) and HEMA (120 g) were reacted in the presence of a chain transfer agent DSH (16 g) and a polymerization initiator V-70 (3.6 g) at 40° C. for 18 hours to obtain a solution of polymer 4. The obtained acetone solution of polymer 4 was poured into water for purification by reprecipitation, followed by vacuum drying to obtain 230 g of powdery polymer 4.

Then, in acetone (100 g) solvent, polymer 4 (100 g), MOI (60 g), DBTDL (0.4 g) and BHT (3.0 g) were reacted at 30° C. for 18 hours to prepare copolymer (C5). The obtained acetone solution of copolymer (C5) was poured into water for purification by reprecipitation, followed by vacuum drying to obtain 155 g of powdery copolymer (C5). Of copolymer (C5), the fluorine content was 23 mass % and the number average molecular weight (Mn) was 4,500.

Preparation Example 9

Preparation of Copolymer (C6)

In acetone (100 g) solvent, polymer 4 (100 g) obtained in Preparation Example 8, AOI (54 g), DBTDL (0.3 g) and BHT (2.7 g) were reacted at 30° C. for 18 hours to prepare copolymer (C6). The obtained acetone solution of copolymer (C6) was poured into water for purification by reprecipitation, followed by vacuum drying to obtain 149 g of powdery copolymer (C6). Of copolymer (C6), the fluorine content was 24 mass % and the number average molecular weight (Mn) was 4,500.

Preparation Example 10

Preparation of Copolymer (C7)

In acetone (555 g) solvent, C6FMA (96 g), MAA (72 g) and HBA (72 g) were reacted in the presence of a chain transfer agent DSH (9.7 g) and a polymerization initiator V-70 (5 g) at 40° C. for 18 hours to obtain a solution of polymer 5. The obtained acetone solution of polymer 5 was poured into water for purification by reprecipitation, followed by vacuum drying to obtain 230 g of powdery polymer 5.

Then, in acetone (100 g) solvent, polymer 5 (100 g), AC (20 g) and TEA (22 g) were reacted at 0° C. for 6 hours to prepare copolymer (C7). The obtained acetone solution of copolymer (C7) was poured into water for purification by reprecipitation, followed by vacuum drying to obtain 110 g of powdery copolymer (C7). Of copolymer (C7), the fluorine content was 27 mass % and the number average molecular weight (Mn) was 6,000.

Preparation Example 11

Preparation of Copolymer (C8)

In acetone (555 g) solvent, C6FMA (120 g) and HBA (120 g) were reacted in the presence of a chain transfer agent DSH (16 g) and a polymerization initiator V-70 (3.6 g) at 40° C. for 18 hours to obtain a solution of polymer 6. The obtained acetone solution of polymer 6 was poured into water for purification by reprecipitation, followed by vacuum drying to obtain 230 g of powdery polymer 6.

Then, in acetone (100 g) solvent, polymer 6 (100 g), AC (31 g) and TEA (40 g) were reacted at 0° C. for 6 hours to prepare copolymer (C8). The obtained acetone solution of copolymer (C8) was poured into water for purification by reprecipitation, followed by vacuum drying to obtain 125 g of powdery copolymer (C8). Of copolymer (C8), the fluorine content was 31 mass % and the number average molecular weight (Mn) was 4,000.

Preparation Example 12

Preparation of Copolymer (C9)

In 2-butanone (245 g) solvent, iC3FMA (50 g) and HEMA (55 g) were reacted in the presence of a chain transfer agent DSH (9.1 g) and a polymerization initiator V-70 (1.2 g) at 50° C. for 24 hours, and then reacted at 70° C. for 2 hours.

After the mixture was cooled to room temperature (20 to 25° C.), AOI (60 g), DBTDL (0.2 g) and BHT (3.0 g) were charged, followed by a reaction at 40° C. for 24 hours to prepare copolymer (C9). The obtained 2-butanone solution of copolymer (C9) was poured into hexane for purification by reprecipitation, followed by vacuum drying to obtain 155 g of powdery copolymer (C9). Of copolymer (C9), the fluorine content was 12 mass % and the number average molecular weight (Mn) was 6,000.

Preparation Example 13

Preparation of Copolymer (C10)

In 2-butanone (199 g) solvent, the compound (4-2c) (50 g) and HEMA (35 g) were reacted in the presence of a chain transfer agent DSH (5.2 g) and a polymerization initiator V-70 (0.7 g) at 50° C. for 24 hours, and then reacted at 70° C. for 2 hours.

After the mixture was cooled to room temperature (20 to 25° C.), AOI (38 g), DBTDL (0.2 g) and BHT (1.9 g) were charged, followed by a reaction at 40° C. for 24 hours to prepare copolymer (C10). The obtained 2-butanone solution of copolymer (C10) was poured into hexane for purification by reprecipitation, followed by vacuum drying to obtain 115 g of powdery copolymer (C10). Of copolymer (C10), the fluorine content was 18 mass % and the number average molecular weight (Mn) was 5,500.

Preparation Example 14

Preparation of copolymer (C11)

In 2-butanone (197 g) solvent, the compound (4-3a) (50 g) and HEMA (34 g) were reacted in the presence of a chain transfer agent DSH (5.1 g) and a polymerization initiator V-70 (0.7 g) at 50° C. for 24 hours, and then reacted at 70° C. for 2 hours.

After the mixture was cooled to room temperature (20 to 25° C.), AOI (37 g), DBTDL (0.1 g) and BHT (1.9 g) were charged, followed by a reaction at 40° C. for 24 hours to prepare copolymer (C11). The obtained 2-butanone solution of copolymer (C11) was poured into hexane for purification by reprecipitation, followed by vacuum drying to obtain 115 g of powdery copolymer (C11). Of copolymer (C11), the fluorine content was 18 mass % and the number average molecular weight (Mn) was 6,000.

Preparation Example 15

Preparation of copolymer (C12)

In 2-butanone (184 g) solvent, the compound (4-5a) (50 g) and HEMA (29 g) were reacted in the presence of a chain transfer agent DSH (4.3 g) and a polymerization initiator V-70 (0.6 g) at 50° C. for 24 hours, and then reacted at 70° C. for 2 hours.

After the mixture was cooled to room temperature (20 to 25° C.), AOI (31 g), DBTDL (0.1 g) and BHT (1.6 g) were charged, followed by a reaction at 40° C. for 24 hours to prepare copolymer (C12). The obtained 2-butanone solution of copolymer (C12) was poured into hexane for purification by reprecipitation, followed by vacuum drying to obtain 100 g of powdery copolymer (C12). Of copolymer (C12), the fluorine content was 17 mass % and the number average molecular weight (Mn) was 6,000.

Preparation Example 16

Preparation of Copolymer (C13)

In 2-butanone (212 g) solvent, the compound (4-2a) (50 g) and HEMA (41 g) were reacted in the presence of a chain transfer agent DSH (6.0 g) and a polymerization initiator V-70 (0.8 g) at 50° C. for 24 hours, and then reacted at 70° C. for 2 hours.

After the mixture was cooled to room temperature (20 to 25° C.), AOI (44 g), DBTDL (0.2 g) and BHT (2.2 g) were charged, followed by a reaction at 40° C. for 24 hours to prepare copolymer (C13). The obtained 2-butanone solution of copolymer (C13) was poured into hexane for purification by reprecipitation, followed by vacuum drying to obtain 125 g of powdery copolymer (C13). Of copolymer (C13), the fluorine content was 19 mass % and the number average molecular weight (Mn) was 5,500.

Preparation Example 17

Preparation of Copolymer (C14)

In 2-butanone (288 g) solvent, the compound (4-2b) (50 g) and HEMA (73 g) were reacted in the presence of a chain transfer agent DSH (11 g) and a polymerization initiator V-70 (1.5 g) at 50° C. for 24 hours, and then reacted at 70° C. for 2 hours.

After the mixture was cooled to room temperature (20 to 25° C.), AOI (79 g), DBTDL (0.3 g) and BHT (4.0 g) were charged, followed by a reaction at 40° C. for 24 hours to prepare copolymer (C14). The obtained 2-butanone solution of copolymer (C14) was poured into hexane for purification by reprecipitation, followed by vacuum drying to obtain 195 g of powdery copolymer (C14). Of copolymer (C14), the fluorine content was 9 mass % and the number average molecular weight (Mn) was 5,000.

Preparation Example 18

Preparation of Copolymer (C15)

In 2-butanone (174 g) solvent, the compound (4-2b) (50 g) and HEMA (24 g) were reacted in the presence of a chain transfer agent DSH (5.4 g) and a polymerization initiator V-70 (0.7 g) at 50° C. for 24 hours, and then reacted at 70° C. for 2 hours.

After the mixture was cooled to room temperature (20 to 25° C.), AOI (27 g), DBTDL (0.1 g) and BHT (1.3 g) were charged, followed by a reaction at 40° C. for 24 hours to prepare copolymer (C15). The obtained 2-butanone solution of copolymer (C15) was poured into hexane for purification by reprecipitation, followed by vacuum drying to obtain 90 g of powdery copolymer (C15). Of copolymer (C15), the fluorine content was 18 mass % and the number average molecular weight (Mn) was 5,000.

Preparation Example 19

Preparation of Copolymer (C16)

In 2-butanone (136 g) solvent, the compound (4-2b) (50 g) and HEMA (8.1 g) were reacted in the presence of a chain transfer agent DSH (3.6 g) and a polymerization initiator V-70 (0.5 g) at 50° C. for 24 hours, and then reacted at 70° C. for 2 hours.

After the mixture was cooled to room temperature (20 to 25° C.), AOI (8.8 g), DBTDL (0.04 g) and BHT (0.4 g) were charged, followed by a reaction at 40° C. for 24 hours to prepare copolymer (C16). The obtained 2-butanone solution of copolymer (C16) was poured into hexane for purification by reprecipitation, followed by vacuum drying to obtain 60 g of powdery copolymer (C16). Of copolymer (C16), the fluorine content was 27 mass % and the number average molecular weight (Mn) was 6,500.

Example 1 to 24, 31 to 50 and 51 to 60

Using prepolymers (A) and copolymers (C) obtained in the above Preparation Examples and the following materials, curable compositions were prepared in blend ratios as identified in Tables 1 to 3. Using each of the curable compositions, a cured film was formed by the following method and evaluated. The evaluation results are shown in Tables.

Examples 1 to 5, 11 to 24 and 51 to 59 are Examples of thermal curing, and Examples 6 to 10, 31 to 50 and 60 are Examples of photo-curing. Examples 3 to 5, 8 to 10, 18 to 24 and 42 to 50 are Comparative Examples, and Examples 2 and 7 are Reference Examples. The other are Examples of the present invention.

<Compound (B)>
ADCP: tricyclodecane dimethanol diacrylate (number average molecular weight (Mn): 304)
ATMPT: trimethylolpropane triacrylate (number average molecular weight (Mn): 296)
M408: ditrimethylolpropane tetraacrylate (number average molecular weight (Mn): 466)
ADPH: dipentaerythritol hexaacrylate (number average molecular weight (Mn): 578)<
Photoinitiator (D1)>
AIBN: azobisisobutylonitrile
BPO: benzoyl peroxide <Photoinitiator (D2)>
OXE01: 1,2-octanedione,1-[4-(phenylthio)-,2-(o-benzoyloxime)]
OXE02: ethanone,1-[9-ethyl-6-(2-methylbenzoyl)-9H-carbazol-3-yl]-,1-(o-acetyloxime)
<Solvent>
PGMEA: propylene glycol monomethyl ether acetate Examples 1 to 5, 11 to 24 and 51 to 59

Thermal Curing

The prepolymer (A), the compound (B), the copolymer (C), the thermal initiator (D1) and the solvent were mixed in ratios as identified in Tables 1, 2 and 4 to obtain coating compositions.

Each of the obtained coating compositions was applied on a glass substrate by spin coating at 1,000 revolutions per minute for 30 seconds, and heated on a hot plate (prebaked) under heating conditions of 150° C. for 2 minutes, and then heated in an oven at 150° C. for 10 minutes (curing step) to obtain a cured film having a thickness of 1 µm. The solvent resistance of the obtained cured film was evaluated. Further, in Examples 11 to 24, the contact angle and the dielectric constant were measured. The results are shown in Tables 1, 2 and 4.

Examples 6 to 10, 31 to 50 and 60

Photo-Curing

The prepolymer (A), the compound (B), the copolymer (C), the photoinitiator (D2) and the solvent were mixed in ratios as identified in Tables 1, 3 and 4 to obtain coating compositions.

Each of the obtained coating compositions was applied on a glass substrate by spin coating at 1,000 revolutions per minute for 30 seconds, and heated on a hot plate (prebaked) under heating conditions of 60° C. for 90 seconds. Then, exposure with an irradiation energy of 200 mJ/cm$^2$ was carried out. Exposure was carried out by using an ultraviolet exposure apparatus MA-6 (tradename, manufactured by SUSS MicroTec AG.) using a high pressure mercury lamp as a light source. With respect to the non-exposed portion, an area of ⅓ of the substrate was shielded from light using a metal foil or a mask.

Then, heating was carried out on a hot plate at 120° C. for 2 hours (post-exposure baking). Then, using PGMEA, paddle development was carried out for 20 seconds, followed by spin drying at 2,000 revolutions per minute for 30 seconds. Then, heating was carried out on a hot plate at 100° C. for 5 minutes (curing step) to obtain a cured film having a thickness of 1 µm. The solvent resistance of the obtained cured film was evaluated. Further, in Examples 31 to 50 and 60, the contact angle and the dielectric constant were measured. The results are shown in Tables 1, 3 and 4.

TABLE 1

|  |  |  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|---|
| Composition (parts by mass) | (A) | A3 | 60 | 60 | 100 | 100 | 60 | 60 | 60 | 100 | 100 | 100 |
|  | (B) | ATMPT |  |  |  |  |  |  | 40 |  |  |  |
|  |  | M408 | 40 |  |  |  |  |  |  |  |  |  |
|  |  | ADPH |  | 40 |  |  | 40 |  | 40 |  |  | 40 |
|  | (C) | C6 | 0.5 |  |  |  |  | 0.5 |  |  |  |  |
|  | (D1) | BPO | 6 | 6 | 8 |  |  |  |  |  |  |  |
|  | (D2) | OXE01 |  |  |  |  |  | 10 | 10 |  | 10 |  |
|  |  | Solvent PGMEA | 250 | 250 | 250 | 250 | 250 | 250 | 250 | 250 | 250 | 250 |

TABLE 1-continued

|  |  | Ex. 1 | Ex. 2 | Ex. 3 | Ex. 4 | Ex. 5 | Ex. 6 | Ex. 7 | Ex. 8 | Ex. 9 | Ex. 10 |
|---|---|---|---|---|---|---|---|---|---|---|---|
| Evaluation | Swell ratio (%) | 1 | 3 | — | 10 | — | 1 | 5 | X | 10 | X |
|  | Film remaining ratio (%) | 99 | 95 | 0 | 80 | 0 | 100 | 100 |  | 100 |  |
|  | Solvent resistance | ○ | ○ | X | Δ | X | ○ | ○ | — | Δ | — |

TABLE 2

|  |  |  | Ex. 11 | Ex. 12 | Ex. 13 | Ex. 14 | Ex. 15 | Ex. 16 | Ex. 17 | Ex. 18 | Ex. 19 | Ex. 20 | Ex. 21 | Ex. 22 | Ex. 23 | Ex. 24 |
|---|---|---|---|---|---|---|---|---|---|---|---|---|---|---|---|---|
| Composition (parts by mass) | (A) | A1 | 80 | 80 | 80 |  |  |  |  | 100 | 100 |  |  |  |  |  |
|  |  | A2 |  |  |  | 80 | 80 |  |  |  |  | 100 | 100 |  |  |  |
|  |  | A3 |  |  |  |  |  | 60 | 60 |  |  |  |  | 100 | 100 | 100 |
|  | (B) | ADCP |  | 20 |  |  |  |  |  |  |  |  |  |  |  |  |
|  |  | ATMPT |  |  |  | 20 | 20 |  |  |  |  |  |  |  |  |  |
|  |  | M408 |  |  |  |  |  | 40 | 40 |  |  |  |  |  |  |  |
|  |  | ADPH | 20 |  | 20 |  |  |  |  |  |  |  |  |  |  |  |
|  | (C) | C1 |  |  |  |  |  |  |  | 10 |  |  |  |  |  |  |
|  |  | C2 |  |  |  | 5 |  | 0.5 |  |  | 10 | 5 |  |  |  |  |
|  |  | C3 | 10 |  |  |  |  |  |  |  |  |  |  |  | 1 |  |
|  |  | C4 |  | 10 |  |  |  |  |  |  |  |  |  | 5 |  |  |
|  |  | C5 |  |  |  |  |  |  |  |  |  |  |  |  |  | 1 |
|  |  | C6 |  |  |  |  |  |  | 0.5 |  |  |  |  |  |  |  |
|  |  | C7 |  |  | 10 |  |  |  |  |  |  |  |  |  |  |  |
|  |  | C8 |  |  |  |  | 1 |  |  |  |  |  | 5 |  |  |  |
|  | (D1) | AIBN | 8 |  |  | 8 |  |  |  | 10 | 10 | 10 |  | 10 | 10 |  |
|  |  | BPO |  | 8 | 6 |  | 8 | 6 | 6 |  |  |  | 10 |  |  | 8 |
|  | Solvent | PGMEA | 250 | 250 | 250 | 250 | 250 | 250 | 250 | 250 | 250 | 250 | 250 | 250 | 250 | 250 |
| Evaluation |  | Water contact angle (°) | 105 | 112 | 109 | 105 | 104 | 95 | 100 | 110 | 110 | 104 | 103 | 101 | 99 | 100 |
|  |  | PGMEA contact angle (°) | 55 | 53 | 54 | 56 | 52 | 45 | 50 | 56 | 57 | 54 | 57 | 56 | 52 | 53 |
|  |  | Relative dielectric constant | 2.7 | 2.7 | 2.7 | 2.7 | 2.7 | 2.9 | 2.9 | 2.5 | 2.5 | 2.6 | 2.6 | 2.7 | 2.7 | 2.7 |
|  |  | Solvent resistance | ○ | ○ | ○ | ○ | ○ | ○ | ○ | Δ | Δ | Δ | Δ | Δ | Δ | Δ |

TABLE 3

|  |  |  | Ex. 31 | Ex. 32 | Ex. 33 | Ex. 34 | Ex. 35 | Ex. 36 | Ex. 37 | Ex. 38 | Ex. 39 | Ex. 40 | Ex. 41 |
|---|---|---|---|---|---|---|---|---|---|---|---|---|---|
| Composition (parts by mass) | (A) | A1 | 80 | 80 | 80 |  |  |  |  |  |  |  |  |
|  |  | A2 |  |  |  | 60 | 60 | 60 | 60 |  |  |  |  |
|  |  | A3 |  |  |  |  |  |  |  | 60 | 60 | 60 | 60 |
|  | (B) | ADCP | 20 |  |  |  |  |  |  | 40 |  | 40 |  |
|  |  | ATMPT |  | 20 |  |  |  |  |  |  | 40 |  | 40 |
|  |  | M408 |  |  | 20 | 40 |  | 40 |  |  |  |  |  |
|  |  | ADPH |  |  |  |  | 40 |  | 40 |  |  |  |  |
|  | (C) | C1 |  |  |  |  |  |  |  |  |  |  |  |
|  |  | C2 |  |  |  |  |  |  |  | 0.5 | 0.5 |  |  |
|  |  | C3 |  |  |  |  |  |  |  |  |  |  |  |
|  |  | C4 |  |  |  |  |  |  |  |  |  |  |  |
|  |  | C5 |  |  |  | 1 |  |  |  |  |  |  |  |
|  |  | C6 | 5 |  |  |  |  |  |  |  |  | 0.5 | 0.5 |
|  |  | C7 |  | 5 |  |  | 1 | 0.5 |  |  |  |  |  |
|  |  | C8 |  |  | 1 |  |  |  | 0.5 |  |  |  |  |
|  | (D2) | OXE01 | 5 |  |  | 10 | 10 |  |  | 10 | 10 | 10 | 10 |
|  |  | OXE02 |  | 5 | 5 |  |  | 5 | 5 |  |  |  |  |
|  | Solvent | PGMEA | 250 | 250 | 250 | 250 | 250 | 250 | 250 | 250 | 250 | 250 | 250 |
| Evaluation |  | Water contact angle (°) | 96 | 94 | 95 | 99 | 96 | 95 | 95 | 95 | 95 | 96 | 97 | 95 |
|  |  | PGMEA contact angle (°) | 47 | 48 | 45 | 44 | 46 | 44 | 43 | 46 | 47 | 48 | 45 |
|  |  | Relative dielectric constant | 2.6 | 2.6 | 2.6 | 2.9 | 2.9 | 2.9 | 2.9 | 2.9 | 2.9 | 2.9 | 2.9 |
|  |  | Solvent resistance | ○ | ○ | ○ | ○ | ○ | ○ | ○ | ○ | ○ | ○ | ○ |

|  |  |  | Ex. 42 | Ex. 43 | Ex. 44 | Ex. 45 | Ex. 46 | Ex. 47 | Ex. 48 | Ex. 49 | Ex. 50 |
|---|---|---|---|---|---|---|---|---|---|---|---|
| Composition (parts by mass) | (A) | A1 |  | 100 | 100 | 100 | 100 |  |  |  |  |
|  |  | A2 |  |  |  |  |  | 100 | 100 |  |  |
|  |  | A3 |  |  |  |  |  |  |  | 100 | 100 | 100 |

TABLE 3-continued

|  |  |  |  |  |  |  |  |  |  |  |
|---|---|---|---|---|---|---|---|---|---|---|
| (B) | ADCP |  |  |  |  |  |  |  |  |  |
|  | ATMPT |  |  |  |  |  |  |  |  |  |
|  | M408 |  |  |  |  |  |  |  |  |  |
|  | ADPH |  |  |  |  |  |  |  |  |  |
| (C) | C1 |  |  |  |  | 1 |  |  |  |  |
|  | C2 | 5 |  |  |  |  |  |  |  |  |
|  | C3 |  | 5 |  |  |  |  |  |  |  |
|  | C4 |  |  | 1 |  |  | 1 |  |  |  |
|  | C5 |  |  |  | 1 |  |  |  |  |  |
|  | C6 |  |  |  |  |  |  |  |  |  |
|  | C7 |  |  |  |  |  |  |  |  |  |
|  | C8 |  |  |  |  |  |  | 10 | 5 | 1 |
| (D2) | OXE01 |  |  | 10 | 10 | 10 |  | 5 |  |  |
|  | OXE02 | 10 | 10 |  |  |  | 10 |  | 10 | 10 |
| Solvent | PGMEA | 250 | 250 | 250 | 250 | 250 | 250 | 250 | 250 | 250 |
| Evaluation | Water contact angle (°) | 96 | 94 | 98 | 97 | 98 | 97 | 105 | 100 | 95 |
|  | PGMEA contact angle (°) | 50 | 48 | 46 | 45 | 45 | 47 | 50 | 54 | 47 |
|  | Relative dielectric constant | 2.5 | 2.5 | 2.5 | 2.5 | 2.6 | 2.6 | 2.7 | 2.7 | 2.7 |
|  | Solvent resistance | Δ | Δ | Δ | Δ | Δ | Δ | Δ | Δ | Δ |

TABLE 4

|  |  |  | Ex. 51 | Ex. 52 | Ex. 53 | Ex. 54 | Ex. 55 | Ex. 56 | Ex. 57 | Ex. 58 | Ex. 59 | Ex. 60 |
|---|---|---|---|---|---|---|---|---|---|---|---|---|
| Composition (parts by mass) | (A) | A3 | 60 | 60 | 60 | 60 | 60 | 60 | 60 | 60 | 60 | 60 |
|  | (B) | ADCP |  |  |  |  |  |  |  |  |  | 40 |
|  |  | ATMPT |  |  |  |  |  |  |  |  | 20 |  |
|  |  | M408 | 40 | 40 | 40 | 40 | 40 | 40 | 40 | 40 | 20 |  |
|  | (C) | C9 | 2.5 |  |  |  |  |  |  |  |  |  |
|  |  | C10 |  | 2.5 |  |  |  |  |  |  |  |  |
|  |  | C11 |  |  | 2.5 |  |  |  |  |  |  |  |
|  |  | C12 |  |  |  | 2.5 |  |  |  |  |  |  |
|  |  | C13 |  |  |  |  | 2.5 |  |  |  | 2.5 | 2.5 |
|  |  | C14 |  |  |  |  |  | 2.5 |  |  |  |  |
|  |  | C15 |  |  |  |  |  |  | 2.5 |  |  |  |
|  |  | C16 |  |  |  |  |  |  |  | 2.5 |  |  |
|  | (D1) | BPO | 8 | 8 | 8 | 8 | 8 | 8 | 8 | 8 | 8 |  |
|  | (D2) | OXE01 |  |  |  |  |  |  |  |  |  | 10 |
| Solvent | PGMEA | 250 | 250 | 250 | 250 | 250 | 250 | 250 | 250 | 250 | 250 |
| Evaluation | Water contact angle (°) | 85 | 104 | 103 | 101 | 93 | 80 | 85 | 90 | 93 | 90 |
|  | PGMEA contact angle (°) | 35 | 57 | 58 | 57 | 39 | 16 | 21 | 25 | 39 | 35 |
|  | Relative dielectric constant | 2.9 | 2.9 | 2.9 | 2.9 | 2.9 | 2.9 | 2.9 | 2.9 | 2.9 | 2.9 |
|  | Solvent resistance | ○ | ○ | ○ | ○ | ○ | ○ | ○ | ○ | ○ | ○ |

As shown from the results in Table 1, in Examples 1, 2, 7 and 8 in which the prepolymer (A), the compound (B) and the radical polymerization initiator (D) were contained, a cured film excellent in the solvent resistance was obtained.

Whereas, in Example 3 (thermal curing) in which the prepolymer (A) was contained and neither of the compound (B) and the radical polymerization initiator (D) was contained, although a cured film was formed, the film remaining ratio was 0. In Example 8 (photo-curing), curing did not proceed, and no cured film was formed.

Further, in Example 4 (thermal curing) in which no compound (B) was contained although the prepolymer (A) and the radical polymerization initiator (D) were contained, although a cured film was formed, the swell ratio was so high as 10%, and the film remaining ratio was so low as 80%. In Example 9 (photo-curing), the film remaining ratio was 100%, but the swell ratio was so high as 10.

Further, in a case where no radical polymerization initiator (D) was contained even though the prepolymer (A) and the compound (B) were contained, in Example 5 (thermal curing), although a cured film was formed, the film remaining ratio was 0. In Example 10 (photo-curing), curing did not proceed, and no cured film was formed.

As shown from the results in Tables 2, 3 and 4, in Examples 11 to 17, 31 to 41 and 51 to 60 in which the prepolymer (A), the compound (B), the copolymer (C) and the radical polymerization initiator (D) were contained, the solvent resistance of the cured film was favorable, and the relative dielectric constant was low. Particularly in Examples 11 to 17, 31 to 41 and 52 to 54, the water contact angle was at least 94° and the PGMEA contact angle was at least 43°, and the water repellency and the oil repellency on the surface of the cured film were excellent.

Further, in Examples 18 to 24 and 42 to 50 in which the prepolymer (A), the copolymer (C) and the radical polymerization initiator (D) were contained and no compound (B) was contained, the relative dielectric constant of the cured film was low, and the water repellency and the oil repellency on the surface of the cured film were favorable, but the solvent resistance of the cured film was poor.

Examples 71 to 78 and 81 to 85

Irradiation Test Using Mask Pattern

Examples 71 to 78

The surface of the cured film obtained in each of Examples 17 and 52 to 58 was selectively irradiated with ultraviolet light by means of a mask pattern. Irradiation with ultraviolet light was carried out by using Spot-Cure SP-7 (manufactured by USHIO INC.) under an irradiation condition of 50 J/cm². Under this condition, light having a wavelength of at most 200 nm is not applied.

With respect to a portion (irradiated portion) irradiated with ultraviolet light and a portion (non-irradiated portion) which was not irradiated, the contact angles were measured by the above method. The results are shown in Table 5.

TABLE 5

| | | | Ex. | | | | | | | |
|---|---|---|---|---|---|---|---|---|---|---|
| | | | Ex. 71 | Ex. 72 | Ex. 73 | Ex. 74 | Ex. 75 | Ex. 76 | Ex. 77 | Ex. 78 |
| | Curable composition | | Ex. 17 | Ex. 52 | Ex. 53 | Ex. 54 | Ex. 55 | Ex. 56 | Ex. 57 | Ex. 58 |
| Water | Before irradiation | | 100 | 104 | 103 | 101 | 93 | 80 | 85 | 90 |
| contact angle (°) | After irradiation | Irradiated portion | 100 | 94 | 76 | 65 | 52 | 55 | 61 | 69 |
| | | Non-irradiated portion | 100 | 104 | 103 | 101 | 93 | 80 | 85 | 90 |
| PGMEA | Before irradiation | | 50 | 57 | 58 | 57 | 39 | 16 | 21 | 25 |
| contact angle (°) | After irradiation | Irradiated portion | 50 | <10 | <10 | <10 | <10 | <10 | <10 | <10 |
| | | Non-irradiated portion | 50 | 57 | 58 | 57 | 39 | 16 | 21 | 25 |

In Example 71 in which the curable composition in Example 17 was used, the contact angles at the irradiated portion and non-irradiated portion after irradiation with ultraviolet light were the same. Whereas in Examples 72 to 78 in which the curable compositions in Examples 52 to 58 using the copolymer having units (c1) having a group which promotes decomposition in the presence of light and/or ozone as the copolymer (C) were used, the contact angle at the irradiated portion after the irradiation with ultraviolet light was significantly decreased. That is, the irradiated portion had a lyophilic property and the non-reradiated portion had liquid repellency. By using a mask pattern, a pattern of the lyophilic portion and the liquid repellent portion could be formed on the surface of the cured film.

Examples 81 to 85

The surface of the cured film obtained in each of Examples 17, 52, 55, 57 and 58 was selectively irradiated with ultraviolet light by means of a mask pattern. Irradiation with ultraviolet light was carried out by using a UV cleaning device UV-208 (manufactured by Technovision Inc.) under an irradiation condition of 900 mJ/cm². Under this condition, light having a wavelength of at most 200 nm is applied and ozone is generated.

With respect to the portion (irradiation portion) irradiated with ultraviolet light and a portion (non-irradiated portion) which was not irradiated, the contact angles were measured by the above method. The results are shown in Table 6.

TABLE 6

| | | | Ex. | | | | |
|---|---|---|---|---|---|---|---|
| | | | Ex. 81 | Ex. 82 | Ex. 83 | Ex. 84 | Ex. 85 |
| | Curable composition | | Ex. 17 | Ex. 52 | Ex. 55 | Ex. 57 | Ex. 58 |
| Water | Before irradiation | | 100 | 104 | 93 | 85 | 90 |
| contact angle (°) | After irradiation | Irradiated portion | 76 | <10 | <10 | <10 | <10 |
| | | Non-irradiated portion | 100 | 104 | 93 | 85 | 90 |
| PGMEA | Before irradiation | | 50 | 57 | 39 | 21 | 25 |
| contact angle (°) | After irradiation | Irradiated portion | 31 | <10 | <10 | <10 | <10 |
| | | Non-irradiated portion | 50 | 57 | 39 | 21 | 25 |

In Example 81 in which the curable composition in Example 17 was used, the contact angle at the irradiated portion after irradiation with ultraviolet light was decreased. In Examples 82 to 85 in which the curable compositions in Examples 52, 55, 57 and 58 using the copolymer having units (c1-5) having a group which promotes decomposition in the presence of light and/or ozone as the copolymer (C), were used, the contact angle at the irradiated portion after the irradiation with ultraviolet light was significantly decreased. That is, the irradiated portion had a lyophilic property and the non-reradiated portion had liquid repellency. By using a mask pattern, a pattern of the lyophilic portion and the liquid repellent portion could be formed on the surface of the cured film.

Accordingly, it is found that when the surface of a cured film obtainable by curing the curable composition of the present invention is irradiated with ultraviolet light, the liquid repellency is lowered, and the irradiated portion has a lyophilic property. The tendency how the liquid repellency is decreased varies depending on the irradiation conditions or the composition of the curable composition.

Examples 91 to 96

Preparation and Evaluation of Organic Thin-Film Transistor

Examples 91

Top Contact, Pentane

On a glass substrate, Al was deposited for 30 nm to form a gate electrode. Then, the solution in Example 2 was applied by a spin coater to form a film, which was heated on a hot plate at 90° C. for 10 minutes and at 150° C. for 30 minutes to form a gate insulating film for 200 nm. Then, on the gate insulating film, pentacene as an organic semiconductor was vacuum-deposited to form a film for 30 nm, and Au was vacuum deposited to form a film by means of a metal mask, thereby to form a source electrode and a drain electrode. The gate width was 1 mm, and the gate length was 50 μm.

Of the organic thin-film transistor thus prepared, the voltage-current characteristics were measured in nitrogen at room temperature (from 20 to 25° C.).

Figure 4:
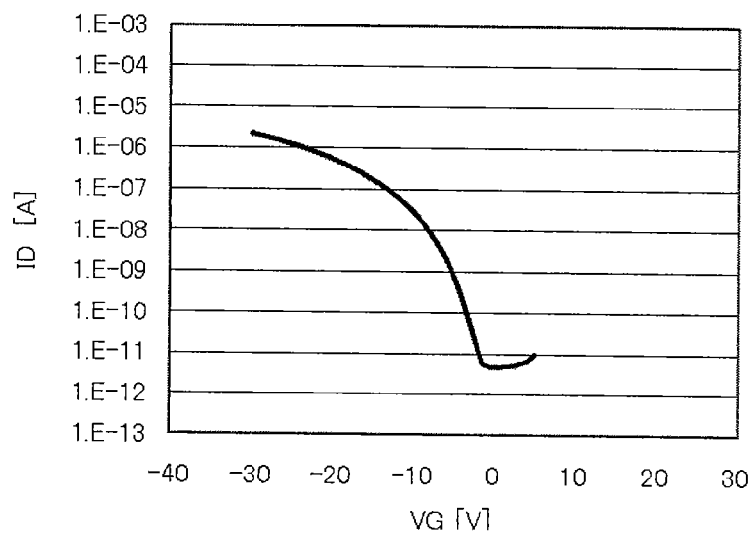
FIG. 4 is a graph illustrating the gate voltage (VG)-drain current (ID) characteristics of the organic thin-film transistor produced in Example 91 when the drain voltage (VD) is –15 V.

In FIG. 4, the gate voltage (VG)-drain current (ID) characteristics when the drain voltage (VD) is −30 V are shown. On that occasion, the mobility (μ) was 0.09 cm$^2$/Vs, and the threshold voltage (VTH) was −11 V. Sufficiently excellent characteristics as an organic transistor were obtained.

The mobility (μ) is calculated by the following method.

The drain current (ID) is represented by the following formula:

$$ID = WC\mu(VG-VTH)^2/2L$$

$$\mu = (2L/WC)(ID/(VG-VTH)^2) = (2L/WC)\alpha^2$$

W: channel width of transistor, C: capacitance of gate insulating film, VG: gate voltage, VTH: threshold voltage, a: slope of graph obtained by plotting square root of absolute value of drain current (ID) on longitudinal axis and gate voltage (VG) on horizontal axis.

From these formulae, the mobility (μ) of an organic semiconductor can be determined from the slope of a graph obtained by plotting the square root of the absolute value of the drain current (ID) on the longitudinal axis and the gate voltage (VG) on the horizontal axis.

Examples 92

Top Contact

An organic thin-film transistor was produced in the same manner as in Example 91 except that the solution in Example 17 was used as the gate insulating film material.

Figure 5:
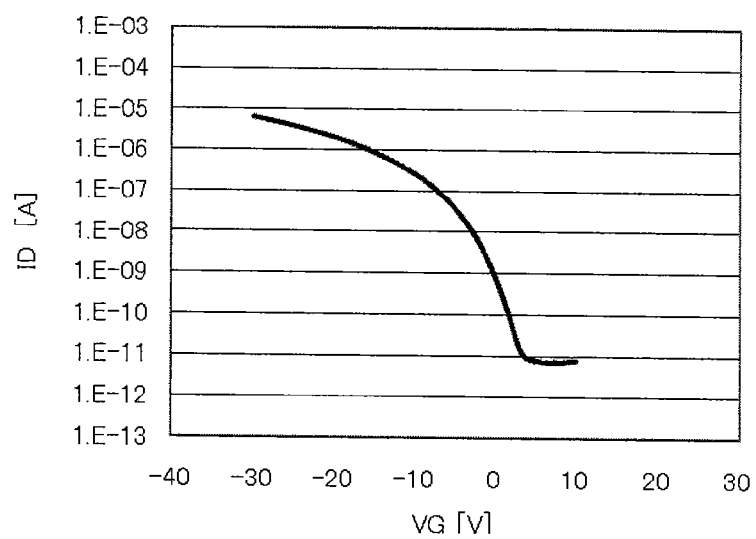
FIG. 5 is a graph illustrating the gate voltage (VG)-drain current (ID) characteristics of the organic thin-film transistor produced in Example 92 when the drain voltage (VD) is –15 V.

In FIG. 5, the gate voltage (VG)-drain current (ID) characteristics when the drain voltage (VD) is −30 V are shown. On that occasion, the mobility (μ) was 0.13 cm$^2$/Vs, and the threshold voltage (VTH) was −5 V. Sufficiently excellent characteristics as an organic transistor were obtained. It was confirmed that the organic thin-film transistor using the solution in Example 17 has a higher response speed, since the mobility (μ) is higher than the mobility (μ) of the organic thin-film transistor in Example 91.

Examples 93

Bottom Contact

On a glass substrate, Al was vapor deposited for 30 nm to form a gate electrode. Then, the solution in Example 2 was applied by a spin coater to form a film, which was heated on a hot plate at 90° C. for 10 minutes and at 150° C. for 30 minutes to form a gate insulating film for 200 nm. Then, Au was vacuum-deposited to form a film by means of a metal mask, thereby to form a source electrode and a drain electrode, and further, pentacene as an organic semiconductor was vacuum deposited to form a film for 50 μm. The gate width was 500 μm, and the gate length was 10 μm.

Of the organic thin-film transistor produced in such a manner, the voltage-current characteristics were measured in nitrogen at room temperature (from 20 to 25° C.).

Figure 6:
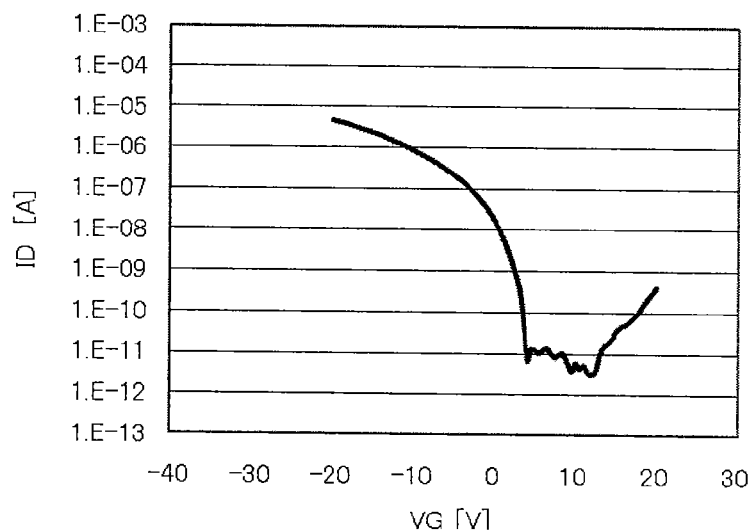
FIG. 6 is a graph illustrating the gate voltage (VG)-drain current (ID) characteristics of the organic thin-film transistor produced in Example 93 when the drain voltage (VD) is –15 V.

In FIG. 6, the gate voltage (VG)-drain current (ID) characteristics when the drain voltage (VD) is −15 V are shown. On that occasion, the mobility (μ) was 0.06 cm$^2$/Vs, and the threshold voltage (VTH) was −3 V. Sufficiently excellent characteristics as an organic transistor were obtained.

Examples 94

Bottom Contact

An organic thin-film transistor was produced in the same as in Example 93 except that the solution in Example 17 was used as the gate insulating film material.

Figure 7:
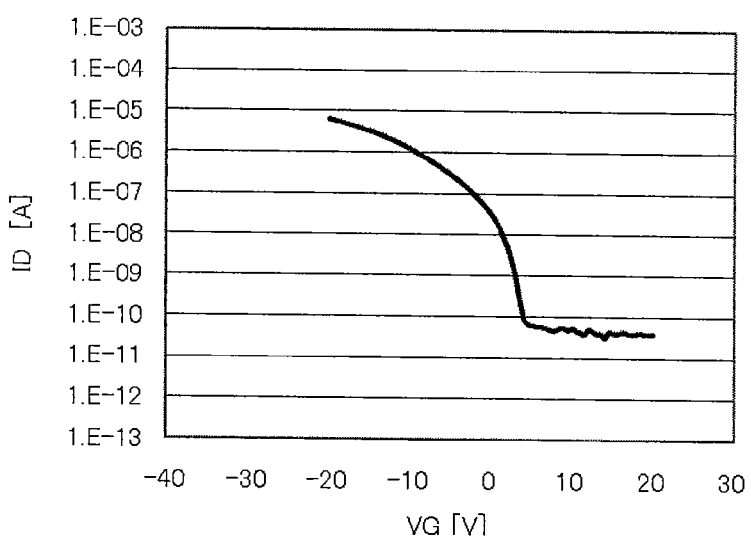
FIG. 7 is a graph illustrating the gate voltage (VG)-drain current (ID) characteristics of the organic thin-film transistor produced in Example 94 when the drain voltage (VD) is −15 V.

In FIG. 7, the gate voltage (VG)-drain current (ID) characteristics when the drain voltage (VD) is −15 V are shown. On that occasion, the mobility (μ) was 0.07 cm$^2$/Vs, and the threshold voltage (VTH) was −3 V. Sufficiently excellent characteristics as an organic transistor were obtained. Further, it was confirmed that the organic thin-film transistor using the solution in Example 17 had a higher response speed, since the mobility (μ) is higher than the mobility (μ) of the organic thin-film transistor in Example 93.

Examples 95

Bottom Contact

On a glass substrate, Al was vapor deposited for 30 nm to form a gate electrode. Then, the solution in Example 2 was applied by a spin coater to form a film, which was heated on a hot plate at 90° C. for 10 minutes and at 120° C. for 60 minutes to form a gate insulating film for 200 nm. Then, Au was vacuum-deposited to form a film by means of a metal mask, thereby to form a source electrode and a drain electrode, and further, PB16TTT as an organic semiconductor was formed into a film for 20 nm by drop casting method. The gate width was 500 μm, and the gate length was 10 μm.

Of the organic thin-film transistor produced in such a manner, the voltage-current characteristics were measured in nitrogen at room temperature (from 20 to 25° C.).

Figure 8:
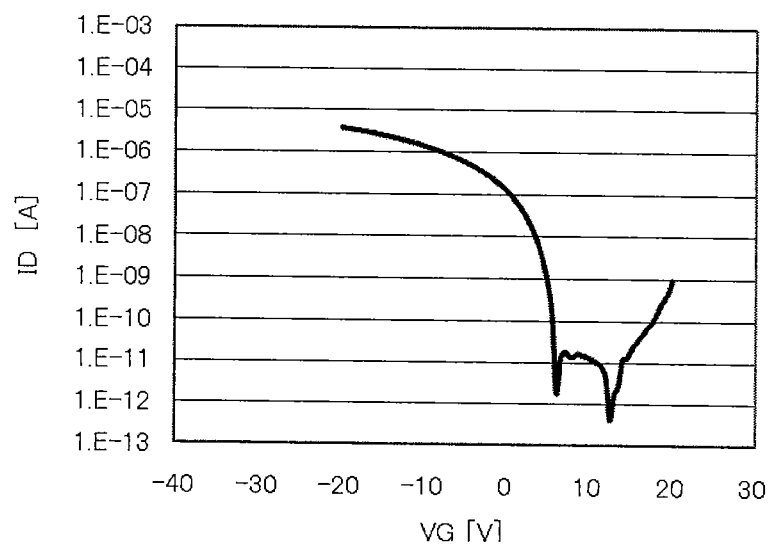
FIG. 8 is a graph illustrating the gate voltage (VG)-drain current (ID) characteristics of the organic thin-film transistor produced in Example 95 when the drain voltage (VD) is −15 V.

In FIG. 8, the gate voltage (VG)-drain current (ID) characteristics when the drain voltage (VD) is −15 V are shown. On that occasion, the mobility (μ) was 0.02 cm²/Vs, and the threshold voltage (VTH) was 9 V. Sufficiently excellent characteristics as an organic transistor were obtained.

Examples 96

Bottom Contact

An organic thin-film transistor was produced in the same as in Example 95 except that the solution in Example 17 was used as the gate insulating film material.

Figure 9:
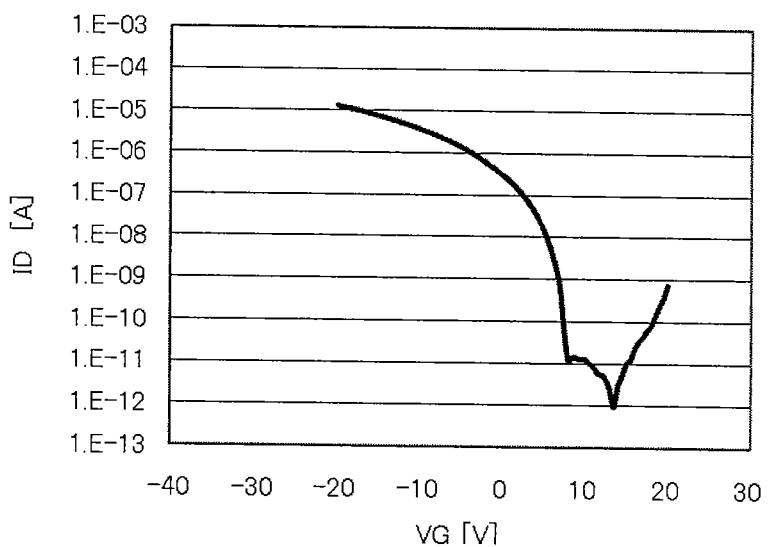
FIG. 9 is a graph illustrating the gate voltage (VG)-drain current (ID) characteristics of the organic thin-film transistor produced in Example 96 when the drain voltage (VD) is −15 V.

In FIG. 9, the gate voltage (VG)-drain current (ID) characteristics when the drain voltage (VD) is −15 V are shown. On that occasion, the mobility (μ) was 0.1 cm²/Vs, and the threshold voltage (VTH) was 1 V. Sufficiently excellent characteristics as an organic transistor were obtained. Further, it was confirmed that the organic thin-film transistor using the solution in Example 17 had a higher response speed, since the mobility (μ) is higher than the mobility (μ) of the organic thin-film transistor in Example 95.

INDUSTRIAL APPLICABILITY

The cured film of the curable composition of the present invention is useful as a functional film for semiconductor devices and other various electronic devices, and the like. Particularly, it is useful as an insulating film of devices such as organic thin-film transistors, and the curable composition of the present invention is used as a material to produce such a functional film.

This application is a continuation of PCT Application No. PCT/JP2011/057699, filed on Mar. 28, 2011, which is based upon and claims the benefit of priority from Japanese Patent Application No. 2010-142828 filed on Jun. 23, 2010. The contents of those applications are incorporated herein by reference in its entirety.

REFERENCE SYMBOLS

1: Substrate
2: Gate electrode
3, 13: Gate insulating film
4, 14: Organic semiconductor layer
5, 15: Source electrode
6, 16: Drain electrode
13a: Hydrophilic region
13b: Liquid repellent region

What is claimed is:
1. A curable composition comprising:
  a fluorinated polyarylene prepolymer (A) having a crosslinkable functional group;
  a compound (B) having a number average molecular weight of from 140 to 5,000, having at least two crosslinkable functional groups and having no fluorine atoms;
  a copolymer (C) comprising units (c1) and (c2); and
  a radical polymerization initiator (D),
  wherein the unit (c1) has no crosslinkable functional groups, and is a unit formed by polymerization of a monomer represented by formula (5):

$$V-(CH_2)_m-Ar-(Y-Ar)_n-X-R^1-Cf \quad (5)$$

wherein
V is a polymerizable group,
Ar is an aromatic ring which may have a $C_{1-15}$ alkyl group or a halogen atom,
$R^1$ is a single bond or a $C_{1-15}$ alkylene group,
Cf is a fluoroalkyl group having at most 20 carbon atoms, which may have an etheric oxygen atom between carbon atoms,
X is $-CH_2O-$ or $-COO-$
Y is a single bond, $-OCH_2-$, $-CH_2O-$, a $C_{1-4}$ alkylene group, $-O-$, $-OCH_2-$, $-CO-$, $-SO_2-$ or $-S-$,
m is an integer of from 0 to 4, and
n is 0 or 1;
wherein the unit (c2) has a crosslinkable functional group; and
wherein the curable composition comprises from 0.1 to 20 parts by mass of the copolymer (C) based on 100 parts by mass of a total amount of the prepolymer (A) and the compound (B).

2. The curable composition of claim 1, wherein each of the crosslinkable functional groups in the prepolymer (A), the compound (B) and the compound (C) which are independent of one another, is a crosslinkable functional group selected from the group consisting of a vinyl group, an allyl group, an ethynyl group, a vinyloxy group, an allyloxy group, an acryloyl group, an acryloyloxy group, a methacryloyl group and a methacryloyloxy group.

3. The curable composition of claim 1, comprising from 10 to 80 parts by mass of the compound (B) based on 100 parts by mass of the total amount of the prepolymer (A) and the compound (B).

4. The curable composition of claim 1, wherein the radical polymerization initiator (D) is a thermal initiator or a photoinitiator.

5. A coating composition comprising the curable composition of claim 1 and a solvent.

6. A process for producing the curable composition of claim 1, the process comprising:
  reacting a fluorinated aromatic compound, a phenol compound and a crosslinkable functional group-comprising organic compound in the presence of a dehydrohalogenating agent to produce the fluorinated polyarylene prepolymer (A) having a crosslinkable functional group, and
  mixing the fluorinated polyarylene prepolymer (A), the compound (B) having a number average molecular weight of from 140 to 5,000, having at least two crosslinkable functional groups and having no fluorine atoms, the copolymer (C) having the units (c1) and (c2), and the radical polymerization initiator (D) to obtain the curable composition.

7. A process for producing a cured film, the process comprising forming a film of the coating composition of claim 5 on a substrate, and thermally curing or photo-curing the curable composition by one or more heating operations to produce a cured film, wherein the heating temperature in all the heating operations is at most 250° C.

8. A substrate comprising a cured film of the curable composition of claim 1.

9. A method for treating a cured film, the method comprising irradiating a cured film of the curable composition of claim 1 with light, which lowers a liquid repellency at a light-irradiated portion.

10. An organic thin-film transistor comprising a cured film obtained by curing a film of the curable composition of claim 1 as a functional film.

11. The organic thin-film transistor of claim 10, wherein the functional film is a gate insulating film.

12. The curable composition of claim 1, wherein the curable composition comprises from 0.1 to 10 parts by mass of the copolymer (C) based on 100 parts by mass of a total amount of the prepolymer (A) and the compound (B).

* * * * *